US012020954B2

(12) United States Patent
Ohashi et al.

(10) Patent No.: US 12,020,954 B2
(45) Date of Patent: Jun. 25, 2024

(54) SUBSTRATE PROCESSING APPARATUS

(71) Applicant: EBARA CORPORATION, Tokyo (JP)

(72) Inventors: Hirotaka Ohashi, Tokyo (JP); Toshio Yokoyama, Tokyo (JP); Mizuki Nagai, Tokyo (JP); Ryu Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 604 days.

(21) Appl. No.: 17/269,807

(22) PCT Filed: Aug. 20, 2019

(86) PCT No.: PCT/JP2019/032450
§ 371 (c)(1),
(2) Date: Aug. 23, 2021

(87) PCT Pub. No.: WO2020/050009
PCT Pub. Date: Mar. 12, 2020

(65) Prior Publication Data
US 2021/0391190 A1     Dec. 16, 2021

(30) Foreign Application Priority Data

Sep. 6, 2018 (JP) .................................. 2018-166484
Aug. 5, 2019 (JP) .................................. 2019-143470

(51) Int. Cl.
*H01L 21/67* (2006.01)
*H01L 21/677* (2006.01)
*H01L 21/687* (2006.01)

(52) U.S. Cl.
CPC .... *H01L 21/67057* (2013.01); *H01L 21/6708* (2013.01); *H01L 21/67742* (2013.01);
(Continued)

(58) Field of Classification Search
None
See application file for complete search history.

(56) References Cited

U.S. PATENT DOCUMENTS

2006/0291990 A1* 12/2006 Wadensweiler .. H01L 21/67173
414/806
2010/0095981 A1    4/2010 Kamikawa
(Continued)

FOREIGN PATENT DOCUMENTS

JP     H05-315314 A    11/1993
JP     H11-145099 A     5/1999
(Continued)

OTHER PUBLICATIONS

International Patent Application No. PCT/JP2019/032450; Int'l Search Report; dated Oct. 8, 2019; 4 pages.

*Primary Examiner* — Cristi J Tate-Sims
(74) *Attorney, Agent, or Firm* — BakerHostetler

(57) ABSTRACT

The present invention relates to a substrate processing apparatus for processing a substrate with a processing liquid. The substrate processing apparatus according to one embodiment includes: a support portion having a placement surface on which a substrate is placed in a horizontal posture; a processing tank configured to supply a processing liquid to the substrate and process the substrate; an elevating portion configured to raise and lower the support portion in order to lower the substrate into the processing tank and raise the substrate from the processing tank; a gripping portion configured to grip a periphery of the substrate supported by the support portion above the processing tank, and receive the substrate from the support portion; and a first nozzle configured to emit a gas onto the substrate, gripped by the gripping portion, to dry the substrate.

9 Claims, 16 Drawing Sheets

(52) U.S. Cl.
CPC .. *H01L 21/68707* (2013.01); *H01L 21/68742* (2013.01); *H01L 21/6875* (2013.01)

(56) References Cited

U.S. PATENT DOCUMENTS

2010/0192992 A1   8/2010  Toshima et al.
2011/0226626 A1   9/2011  Choi et al.

FOREIGN PATENT DOCUMENTS

| | | |
|---|---|---|
| JP | 2015-220369 A | 12/2015 |
| JP | 2018-006404 A | 1/2018 |
| KR | 2004-0016784 A | 2/2004 |
| KR | 2004-0070807 A | 8/2004 |
| TW | 201017798 A | 5/2010 |
| TW | 201419396 A | 5/2014 |

* cited by examiner (a)

(b)

SUBSTRATE PROCESSING APPARATUS

TECHNICAL FIELD

The present invention relates to a substrate processing apparatus for processing a substrate with a processing liquid.

BACKGROUND ART

As a method for forming interconnects and bumps on a substrate, such as a semiconductor wafer, an electroplating is widely used, which is relatively inexpensive and has a short processing time. In an electroplating process, there is known an apparatus in which a substrate provided from an upstream process is set in a substrate holder, and is transported to a processing tank in which the substrate is plated. After the plating process is completed, the substrate holder is removed from the processing tank, and transported to a substrate loading and unloading position where the substrate is removed from the substrate holder. A series of these steps is performed by driving a robot arm and a transporting mechanism.

The substrate that has been removed from the substrate holder after the plating process is required to be cleaned and dried. In a case where the processed substrate is a circular substrate, rotational cleaning and drying with use of SRD (Spin Rinse Dryer) are performed. However, a shape of a substrate varies depending on an intended use of product. In recent years, it has also been required to perform plating on a rectangular substrate having a large size. Thus, there is proposed an apparatus in which, instead of the SRD, a horizontal transporting mechanism using rollers is used, and cleaning and drying processes are performed while maintaining a horizontal posture of a substrate in a transporting process (for example, see Patent Document 1).

CITATION LIST

Patent Literature

Patent document 1: Japanese laid-open patent publication No. 2018-6404

SUMMARY OF INVENTION

Technical Problem

However, a large, and particularly thin substrate is likely to be bended and deformed. For this reason, if a horizontal transporting mechanism using rollers is used in the cleaning and drying process before or after plating, there is a concern that the substrate may interfere with structures, such as rollers, during the transporting process, thus hindering a normal transportation. Such problem can occur in using a thin substrate as well as the rectangular substrate. Further, the same problem may occur not only in the cleaning and drying process but also in an apparatus for processing a thin substrate with a processing liquid.

The present invention has been made in view of the above circumstances. It is therefore one of objects of the present invention to provide a substrate processing apparatus capable of stably processing even a thin substrate.

Solution to Problem

One aspect of the present invention is a substrate processing apparatus. This substrate processing apparatus includes: a support portion having a placement surface on which a substrate is placed in a horizontal posture; a processing tank configured to supply a processing liquid to the substrate and process the substrate; an elevating portion configured to raise and lower the support portion in order to lower the substrate into the processing tank and raise the substrate from the processing tank; a gripping portion configured to grip a periphery of the substrate supported by the support portion above the processing tank, and receive the substrate from the support portion; and a first nozzle configured to emit a gas onto the substrate, gripped by the gripping portion, to dry the substrate.

Advantageous Effects of Invention

According to the substrate processing apparatus of the present invention, stable processing can be performed even on a thin substrate.

DESCRIPTION OF EMBODIMENTS

Figure 1:
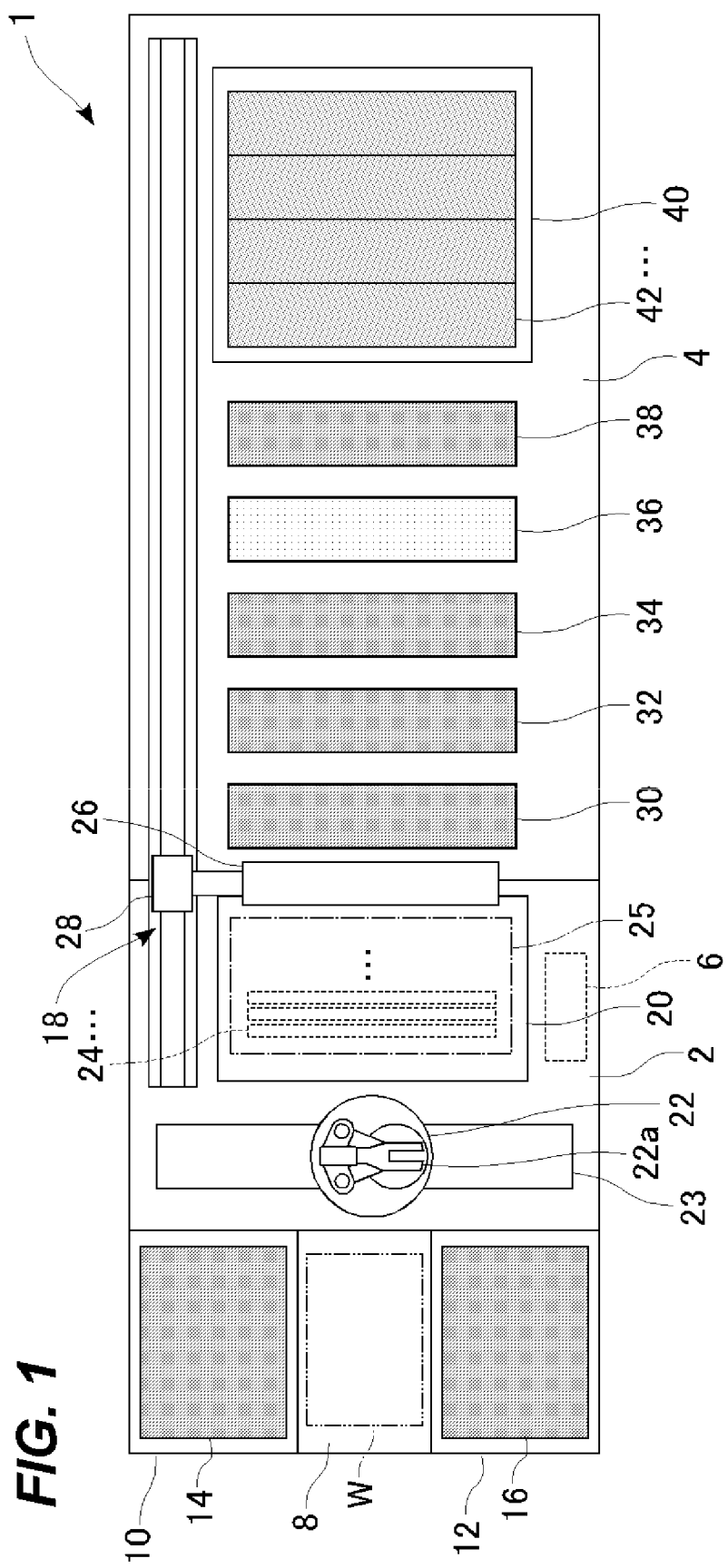
FIG. 1 is a plan view schematically showing a plating apparatus according to a first embodiment.

One embodiment of the present invention is a substrate processing apparatus for processing a substrate with a processing liquid. This process may be a process in which the substrate is immersed in the processing liquid. More specifically, this process may be a cleaning process in which the substrate is immersed in a cleaning liquid. This process may be a plating process in which the substrate is immersed in a plating solution. This process may be a cooling process in which the substrate is immersed in a cooling water. Alternatively, the process may be a process in which the processing liquid may be sprayed onto a surface of the substrate. After the process with the processing liquid, drying of the substrate is performed. In order to perform a series of processes, the substrate processing apparatus includes a processing tank, a processing-liquid supply portion, a processing-liquid discharge portion, a support portion, a gripping portion, an elevating portion, and a first nozzle.

The processing-liquid supply portion supplies a processing liquid into the processing tank. In a case where the substrate is immersed in the processing liquid to thereby be processed, an overflow tank for allowing the processing liquid to overflow the processing tank may be provided in order to keep the processing liquid clean. The overflowed processing liquid may be discarded as it is. Alternatively, a circulation mechanism may be provided to purify the overflowed processing liquid with a filter or the like and return it to the processing tank. After termination of the process, the supply of processing liquid is stopped, and the processing-liquid discharge portion discharges the processing liquid from the processing tank. In a case where the substrate is processed by spraying the processing liquid onto the substrate, a processing-liquid spray nozzle is provided in the processing tank to spray the processing liquid onto the surface of the substrate.

In this embodiment, the substrate is transferred between the support portion and the gripping portion, because the substrate needs to be switched from one process to another in a series of processes. The support portion supports the substrate during process with the processing liquid, and the gripping portion supports the substrate during the drying process. The support portion receives the substrate at a position above the processing tank.

The support portion has a placement surface on which the substrate is placed in a horizontal posture. The support portion includes a plurality of clamp portions (first clamp mechanisms) for stabilizing a placed state of a thin substrate. A periphery of the substrate is clamped between the first clamp mechanisms and the placement surface. The first clamp mechanisms may be used to apply a tension in a peripheral direction (outward direction) of the substrate. This makes it possible to stably hold even a thin substrate without bending it.

When the substrate is to be processed, the support portion on which the substrate is placed is lowered by the elevating portion. In a case where the substrate to be processed is immersed in the processing liquid, the processing liquid may be stored in the processing tank in advance, and the substrate may be lowered into the processing liquid. However, in this case, air bubbles are likely to adhere to a lower surface of the substrate. Further, there is a possibility that liquid splashing may occur, causing the processing liquid to adhere to other structures, and thus causing an adverse effect. Accordingly, the processing liquid may preferably be supplied after lowering of the substrate. Further, it is preferable to supply the processing liquid from below the lower surface of the substrate. With these operations, air bubbles can be efficiently removed by a flow of the processing liquid during rising of the liquid level. The liquid splashing is also less likely to occur. The substrate may be processed with a plurality of types of processing liquids. In this case, it is preferable to supply and discharge the processing liquids successively while holding the substrate in the processing tank.

When the process with use of the processing liquid is terminated, the support portion is raised by the elevating portion. Thereafter, the substrate is transferred from the support portion to the gripping portion. This is because it is difficult to dry the lower surface of the substrate while the substrate is placed on the support portion. The gripping portion grips the periphery of the substrate to allow the upper and lower surfaces of the substrate to be open. The gripping portion may include a plurality of clamp portions (second clamp mechanisms). The second clamp mechanisms may be used to apply a tension in the peripheral direction (outward direction) of the substrate. The first nozzle is configured to emit a gas onto the substrate, horizontally gripped by the gripping portion, to dry the substrate.

According to this embodiment, by placing the substrate on the placement surface, the substrate can be elevated and lowered, and the process with the processing liquid can be performed, while the horizontal posture of the substrate is maintained. The transfer of the substrate for the drying process is also performed while the substrate is placed on the placement surface, so that switching from placing to gripping can be stably performed. Therefore, the substrate is not bent during a series of processes, and does not interfere with other structures. Thus, even a thin substrate can be stably processed.

The support portion may include a frame. A plurality of protrusions may be provided on an upper surface of the frame, and the placement surface may be formed by upper surfaces of the protrusions. The "frame" may have a shape only with an outer frame, or may have a grid pattern. In the latter case, one or more bridge portions are provided so as to bridge the outer frame of the frame. The presence or absence of the bridge portion, and the number thereof can be freely set according to a size of the substrate to be supported. The protrusions may be arranged according to contactable regions (no-mounted areas where circuits or the like are not mounted) of the substrate. With such a configuration, most of the lower surface of the substrate can be open to the processing liquid, so that the processing liquid can be distributed over the entire upper and lower surfaces of the substrate.

The substrate processing apparatus includes a controller for driving and controlling each portion (or each mechanism). The controller instructs the support portion to be lowered after transferring of the substrate from the support portion to the gripping portion, and instructs the first nozzle to dry the substrate. At that time, even if the support portion does not reach a lowering set position, the first nozzle may be operated when the support portion is lowered to a position where it does not interfere with the gripping portion. This operation can improve the processing efficiency as a whole.

The processing liquid may be discharged from the processing tank before or after the support portion is raised. After the substrate is transferred from the support portion to the gripping portion, the support portion may be lowered to the processing tank. This operation enables the support portion to be retreated, utilizing an empty space of the processing tank. The used processing liquid in the processing tank is discharged in advance, so that the placement surface can be kept clean when the support portion is retreated.

A second nozzle may be provided separately from the first nozzle to dry the placement surface of the support portion. In this case, the drying process of the substrate by the first nozzle (first drying process), and the drying process of the placement surface by the second nozzle (second drying process) may be performed in parallel. By performing the two drying processes in parallel, influences due to liquid splashes occurring in each drying process can be suppressed. For example, liquid splashing from the substrate during the first drying process can be prevented from causing harmful influences, such as wetting the placement surface, which is the target of the second drying process. This is especially effective when drying is performed by air blow.

The first drying process may be started during lowering of the support portion, and the second drying process may be started after lowering of the support section is completed. Since drying of the substrate is more important than drying of the placement surface, the first drying process may require a longer processing time than that of the second drying process. In such a case, the first drying process can be started prior to the second drying process to thereby shorten the entire processing time and improve efficiency.

The substrate processing apparatus includes a substrate transporter. This substrate transporter has a support surface for supporting the upper surface of the substrate. The substrate transporter is configured to transport the substrate to the placement surface of the support portion while holding the substrate in a horizontal posture, and to receive the substrate from the placement surface. The "support surface" may be a "suction surface" capable of sucking the upper surface of the substrate in a non-contact state. Alternatively, the "support surface" may be an "adsorption surface" that can contact and absorb the upper surface of the substrate. From the viewpoint of strictly maintaining the cleanliness of the substrate, it is preferable that the support surface is of a non-contact type.

The controller instructs the support portion to move upward after the drying process to allow the substrate to be transferred from the gripping portion to the support portion. At this time, the substrate is placed on the placement surface again, thereby maintaining the horizontal posture thereof. In this way, the substrate, supported on the placement surface, is received by the substrate transporter. With such a configuration, the substrate can be transported with no use of transporting rollers or the like.

Hereinafter, specific examples of this embodiment will be described with reference to the drawings. In the following embodiments and modified examples thereof, substantially the same components are denoted by the same reference numerals, and the descriptions thereof will be omitted as appropriate.

First Embodiment

FIG. 1 is a plan view schematically showing a plating apparatus according to a first embodiment.

The plating apparatus 1 includes a substrate loading and unloading section 2, a plating section 4, and a controller 6. The plating apparatus 1 according to this embodiment is a bump plating apparatus for forming protruding electrodes (i.e., bumps) on a substrate. A substrate transfer table 8 is provided in front of the substrate loading and unloading section 2, and a pre-cleaning section 10 and a post-cleaning section 12 are provided adjacent to the substrate transfer table 8. A device for transferring the substrate, which has been processed in an upstream process, to the substrate transfer table 8 is provided in front of the plating apparatus 1, although the description thereof will be omitted.

The substrate transfer table 8 is configured to allow the substrate W, such as a semiconductor wafer, to be placed in a horizontal posture. In this embodiment, the substrate W is a relatively large and thin substrate, and is therefore likely to bend. Although, in this embodiment, a rectangular substrate having a size of 500 mm×500 mm and a thickness of about 1 mm is used as the substrate W, the size, thickness and shape of the substrate are not limited to this embodiment. The substrate W is a wafer having a copper seed layer provided on an upper surface of the wafer and further having a resist pattern formed on the copper seed layer. If air bubbles are present in resist openings when the substrate W is plated, appropriate plating cannot be performed. In addition, if organic substances or the like adhere to the seed layer, appropriate plating may not be performed.

The pre-cleaning section 10 has a cleaning device 14, which performs pre-cleaning for removing the organic substances and the like adhering to the surface of the substrate W prior to the plating process. The post-cleaning section 12 has a cleaning device 16, which cleans the substrate W that has been removed from a substrate holder 24 after the plating process. A holder transporting mechanism 18 is provided extending from the substrate loading and unloading section 2 to the plating section 4. The controller 6 is configured to control operations of each section.

The substrate loading and unloading section 2 includes a loading and unloading mechanism 20, a substrate transfer robot 22, and a moving mechanism 23. The substrate transfer robot 22 has a robot hand 22a. The substrate transfer robot 22 serves as a "substrate transporter". The substrate transfer robot 22 performs transferring of the substrate W to and from the substrate transfer table 8, and performs transferring of the substrate W to and from each mechanism. The robot hand 22a has a non-contact chuck for holding the substrate W in a horizontal posture. In this embodiment, a Bernoulli chuck is used as the non-contact chuck, but a cyclone type chuck may also be used. A suction pad (vacuum pad) of a contact-type may be used so long as a cleanliness of the substrate W can be maintained.

The moving mechanism 23 moves the substrate transfer robot 22 in accordance with transfer positions of the substrate W. The substrate transfer robot 22 moves to a position near the pre-cleaning section 10 in the pre-cleaning process, and moves to a position near the post-cleaning section 12 in the post-cleaning process.

A stocker 25 for housing substrate holders 24 is provided below the loading and unloading mechanism 20. The loading and unloading mechanism 20 is configured to load and unload the substrate W to and from the substrate holder 24. The holder transporting mechanism 18 includes a gripping mechanism 26 configured to grip the substrate holder 24, and a transporting mechanism 28 configured to transport the substrate holder 24 to each tank of the plating section 4. The loading and unloading mechanism 20 is further configured to load and unload the substrate holder 24 to and from the gripping mechanism 26.

The plating section 4 has a pre-wetting tank 30, a pre-soak tank 32, a rinsing tank 34, a blow tank 36, a rinsing tank 38, and an overflow tank 40, which are arranged in this order from the substrate loading and unloading section 2. A plurality of plating tanks 42 are arranged inside the overflow tank 40. The pre-wetting tank 30 is configured to be able to immerse the substrate W into a deaerated water to wet the substrate W to thereby fill inside of resist openings on the surface of the substrate with the deaerated water. The pre-soak tank 32 is configured to etch away an oxide film formed on the surface of the substrate W with a liquid chemical.

The rinsing tanks 34 and 38 are configured to clean the surface of the substrate W with a deionized water. The rinsing tank 34 is configured to perform water-cleaning before the plating process, and the rinsing tank 38 is configured to perform water-cleaning after the plating process. The blow tank 36 is configured to remove water from the cleaned substrate W. Each plating tank 42 is configured to hold the plating solution therein. The substrate W is immersed in the plating tank 42, and the plating solution is circulated while overflowing the plating tank 42 into the overflow tank 40, enabling the substrate to be plated. The plating process typically entails a longer processing time than cleaning, drying, and other processes. For this reason, the plurality of plating tanks 42 are provided so that a plurality of substrates W can be plated in parallel at the same time.

The transporting mechanism 28 is, for example, a mechanism of linear motor type, and is configured to transport the substrate holder 24 to each tank of the plating section 4. The transporting mechanism 28 utilizes time lags between processes in the plating tanks 42 to transport the substrate holders 24 one after another.

The controller 6 is comprised of a microcomputer, and includes a CPU for executing various arithmetic operations, a ROM for storing control programs and the like, a RAM used as a work area for data storage and program execution, a non-volatile memory for retaining stored contents even after power-off, an input and output interface, a timer for measuring time. Although, in this embodiment, the controller 6 instructs and controls each mechanism, each mechanism may be provided with a controller. In this case, a central controller may be provided to control the controllers of the respective mechanisms.

With the above-described configurations, the plating apparatus 1 generally performs the following operations.

First, the substrate transfer robot 22 takes the substrate W, to be plated, from the substrate transfer table 8, and sets the substrate W in the cleaning device 14. Upon receiving the substrate W, the cleaning device 14 performs a pre-cleaning process for removing organic substances and the like. Details of this cleaning process will be described later. When the pre-cleaning is terminated, the substrate transfer robot 22 removes the substrate W from the cleaning device 14, and transfers the substrate W to the loading and unloading mechanism 20. The loading and unloading mechanism 20 sets the substrate W to the substrate holder 24, and attaches it to the gripping mechanism 26.

The transporting mechanism 28 lifts up the gripping mechanism 26 to transport the substrate holder 24, and immerses the substrate W together with the substrate holder 24 in the pre-wetting tank 30, so that the pre-wetting process with the deaerated water is performed. In this embodiment, the deaerated water is held in the pre-wetting tank 30. However, it is not necessary to limit to this example as long as the pre-wetting process can be performed, in which air in the resist openings on the substrate surface can be replaced with a liquid and the resist openings is filled with the liquid.

As described later, if a pre-wetting process in the cleaning device 14 is sufficient, the pre-wetting tank 30 may not be provided.

The transporting mechanism 28 then removes the substrate holder 24 from the pre-wetting tank 30, transports the substrate holder 24 to the pre-soak tank 32, and immerses the substrate holder 24 in the pre-soak tank 32. A liquid chemical, such as sulfuric acid, or hydrochloric acid, is stored in the pre-soak tank 32. When an oxide film is formed on the seed layer (conductive layer) of the substrate W, the oxide film is removed by performing the pre-soak process with this liquid chemical. With this pre-soak process, a clean metal surface of the seed layer can be exposed.

The transporting mechanism 28 subsequently removes the substrate holder 24 from the pre-soak tank 32, transports the substrate holder 24 to the rinsing tank 34, and immerses the substrate holder 24 in the rinsing tank 34. With this operation, the liquid chemical adhering to the substrate W is washed away with the deionized water. The transporting mechanism 28 subsequently immerses the substrate W in the empty plating tank 42. In this embodiment, copper plating is performed in this plating process. However, the plating solution supplied to the plating tank 42 may be changed so that nickel, gold, or other type of plating can be performed.

The substrate W that has been plated in this way is cleaned in the rinsing tank 38, and then the liquid is removed from the substrate W in the blow tank 36. Then, the substrate W is transported to the loading and unloading mechanism 20. The loading and unloading mechanism 20 removes the substrate holder 24 from the gripping mechanism 26, and removes the substrate W from the substrate holder 24. The substrate transfer robot 22 receives the substrate W from the loading and unloading mechanism 20, and sets the substrate W in the cleaning device 16. Upon receiving the substrate W, the cleaning device 16 performs a post-cleaning process.

Next, configuration and operation of the cleaning device 14 will be described in detail.

Figure 2:
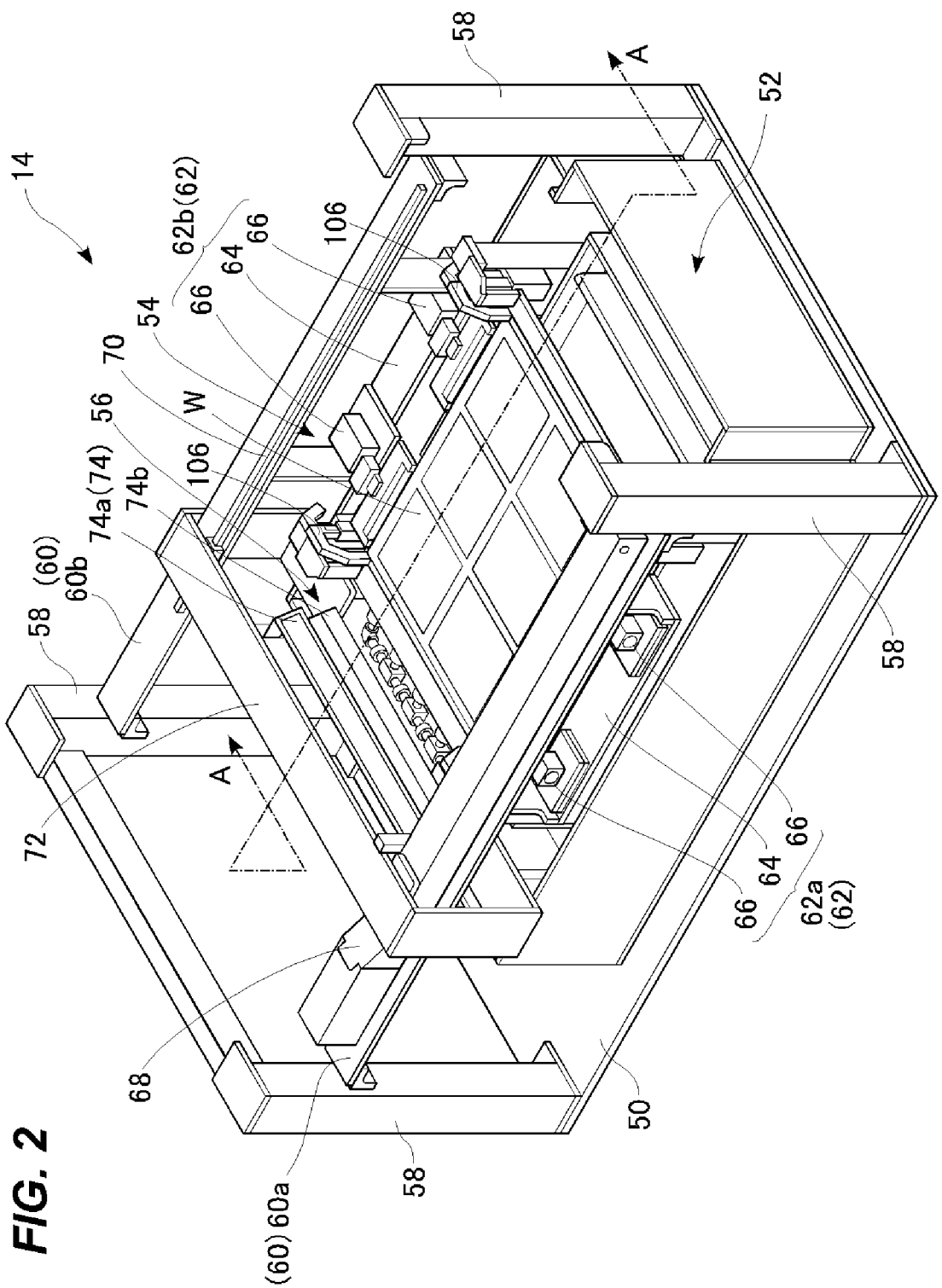
FIG. 2 is a perspective view showing an entire configuration of a cleaning device.

FIG. 2 is a perspective view showing an entire construction of the cleaning device 14.

The cleaning device 14 includes a flat plate-shaped base 50, a cleaning unit 52 mounted to the base 50, a support mechanism 54 for supporting the substrate W above the cleaning unit 52, and a drying mechanism 56 for drying the substrate W above the cleaning unit 52. The support mechanism 54 is a mechanism for supporting the substrate W during the drying process, and serves as "gripping portion". The drying mechanism 56 is a mechanism for drying the substrate W.

Columns 58 stand at four corners of the base 50, and a pair of guide members 60*a* and 60*b* (which may be collectively referred to as "guide members 60" when they are not particularly distinguished) are provided so as to bridge the left and right columns 58. The guide members 60*a* and 60*b* extend horizontally, and are parallel to each other. The support mechanism 54 has a pair of gripping units 62*a* and 62*b* (which may be collectively referred to as "gripping units 62" when they are not particularly distinguished) for holding the substrate W horizontally during the drying process. The gripping unit 62*a* is suspended from and held by the guide member 60*a*, and the gripping unit 62*b* is suspended from and held by the guide member 60*b*.

The gripping unit 62 has a support base 64 extending in parallel with the guide member 60, and a pair of clamp mechanisms 66 arranged along the extending direction of the support base 64. The substrate W is clamped from above and below by a total of four clamp mechanisms 66 included in the pair of gripping units 62, so that the substrate W can be supported horizontally. Details of the clamp mechanism 66 will be described later.

The drying mechanism 56 is supported so as to be movable along the pair of guide members 60. A linear motor 68 for moving the drying mechanism 56 is provided on an upper surface of the guide member 60*a*. A guide rail 70 for guiding the movement of the drying mechanism 56 is provided on an upper surface of the guide member 60*b*. The drying mechanism 56 has a support base 72 suspended from and held by the pair of guide members 60, and a pair of upper and lower air knives 74*a* and 74*b* supported by the support base 72. The air knives 74*a* and 74*b* may be collectively referred to as "air knifes 74" when they are not particularly distinguished. The air knives 74*a* and 74*b* serve as "first nozzle", and are configured to emit air to the substrate W from above and below the substrate W held horizontally during the drying process.

Figure 3:
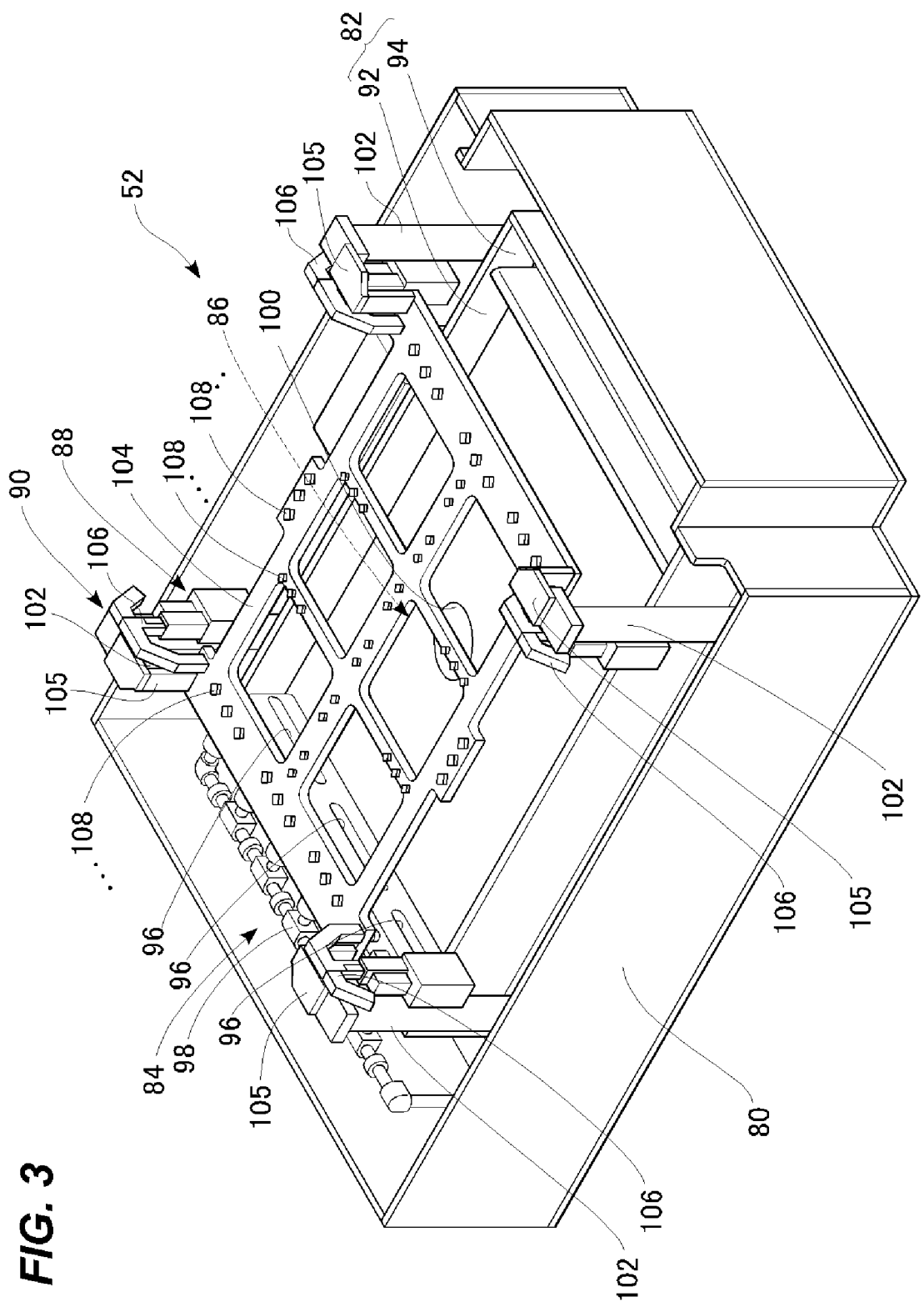
FIG. 3 is a perspective view showing a configuration of a cleaning unit.
Figure 4:
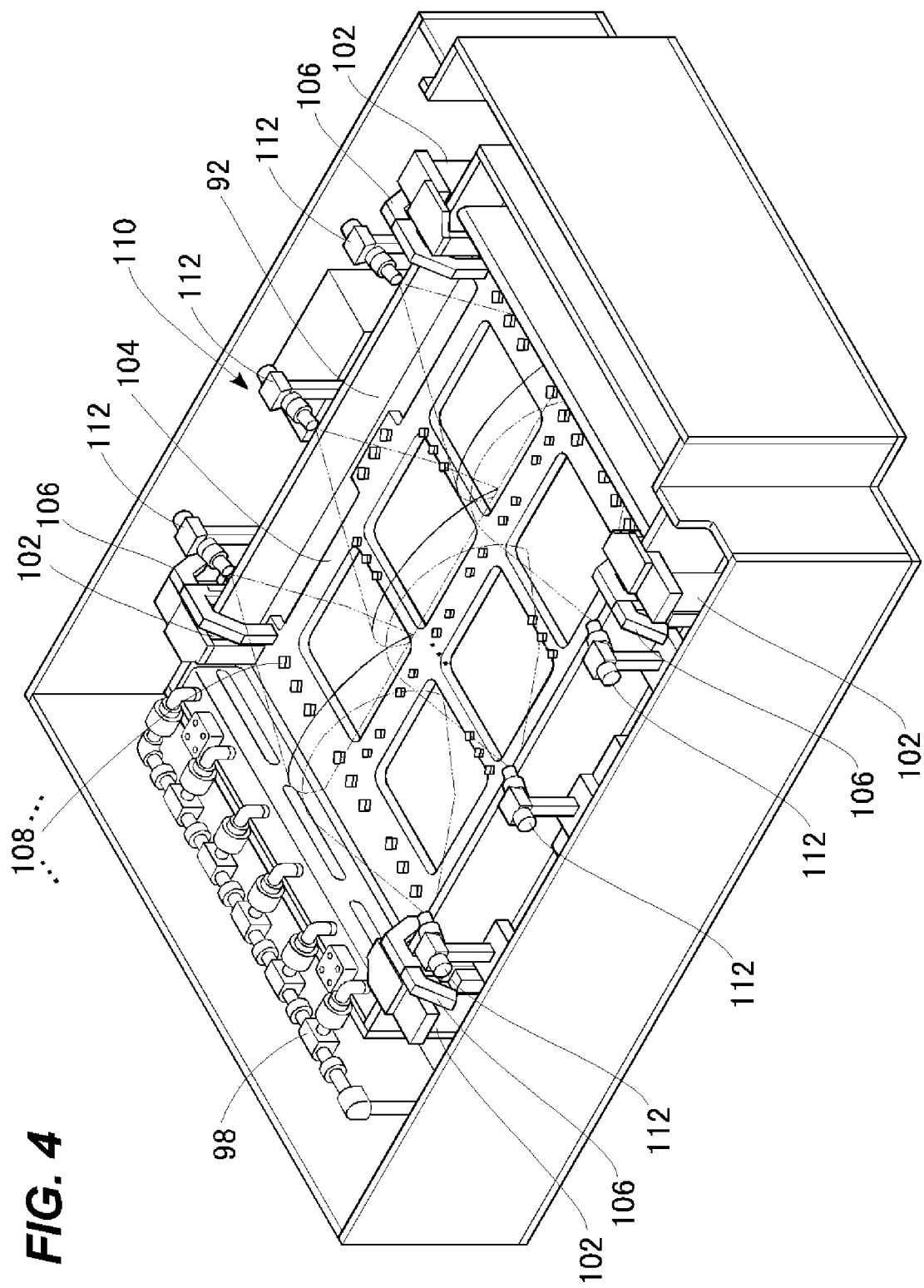
FIG. 4 is a perspective view showing the configuration of the cleaning unit.

FIGS. 3 and 4 are perspective views each showing a configuration of the cleaning unit 52. These drawings illustrate a state in which the cleaning unit 52 showing in FIG. 2 is extracted, with the substrates W removed therefrom. FIG. 3 illustrates a state in which a support mechanism of the cleaning unit 52 is elevated, and FIG. 4 illustrates a state in which the support mechanism of the cleaning unit 52 is lowered.

As shown in FIG. 3, the cleaning unit 52 includes a case 80 configured to house internal mechanisms therein, a processing tank 82 arranged in the case 80, a supply mechanism 84 for supplying cleaning liquid into the processing tank 82, a discharge mechanism 86 for discharging the cleaning liquid from the processing tank 82, a support mechanism 88 capable of supporting the substrate W in a horizontal posture, and an elevating mechanism 90 for elevating and lowering the support mechanism 88. The supply mechanism 84 serves as "processing-liquid supply portion", and the discharge mechanism 86 serves as "processing-liquid discharge portion". The support mechanism 88 serves as "support portion", and the elevating mechanism 90 serves as "elevating portion".

The processing tank 82 includes a cleaning tank 92 into which the cleaning liquid is supplied, and an overflow tank 94 into which the cleaning liquid overflows. Cleaning-liquid supply ports 96 are provided in a side wall of the cleaning tank 92 opposite to the overflow tank 94. In this embodiment, three openings each having a horizontally-elongated shape are provided as the cleaning-liquid supply ports 96. These supply ports 96 are located so as to be lower than a lower surface of the substrate W when a support member 104 (which will be described later) is lowered.

The supply mechanism 84 has a supply pipe 98 communicating with the supply ports 96, and a control valve (i.e., a supply valve and a switching valve) provided upstream of the supply pipe 98. The control valve is not shown in the drawings. The switching valve is configured to switch from one cleaning liquid to another of plural types of cleaning liquids. In this embodiment, three types of cleaning liquids: deaerated water, ozone water, and deionized water (DIW), are prepared. The processing liquid whose supply path is opened by the switching valve is supplied to the supply pipe 98, and is supplied to the cleaning tank 92 by opening the supply valve.

A discharge port 100 is provided in a center of a bottom of the cleaning tank 92. The discharge mechanism 86 has a drain pipe communicating with the discharge port 100, and a control valve (discharge valve) provided on the drain pipe, which are not show in the drawings. When the discharge valve is opened, the processing liquid in the cleaning tank 92 is discharged.

The elevating mechanism 90 includes elevating shafts 102 provided at four corners around the processing tank 82, and air cylinder(s) (not shown) for elevating the elevating shafts 102. The support mechanism 88 includes a support member 104 having a rectangular plate-shape, and clamp mechanisms 106 arranged at four corners around the support member 104. The upward movement and the downward movement of the elevating shafts 102 cause the upward movement and the downward movement of the support member 104 and the clamp mechanisms 106 together. The four clamp mechanisms 106 are configured to fix the substrate W to the support member 104 during the cleaning process. Therefore, the four clamp mechanisms 106 make it possible to prevent the position of the substrate W from being displaced by water pressure of the cleaning liquid supplied to the cleaning tank 92.

The four clamp mechanisms 106 are supported by the four elevating shafts 102, respectively. The four corners of the support member 104 are supported by the four elevating shafts 102, so that the support member 104 can be maintained in a horizontal posture. More specifically, L-shaped suspension members 105 are secured to tops of the elevating shafts 102, respectively, and the four suspension members 105 are coupled to the four corners of the support member 104, respectively.

A plurality of protrusions 108 are provided on an upper surface of the support member 104 along a grid pattern thereof. The substrate W is placed on these protrusions 108. Details of the support member 104 and the clamp mechanism 106 will be described later.

As shown in FIG. 4, a drying mechanism 110 is provided around the cleaning tank 92. The drying mechanism 110 is a mechanism for drying a placement surface (i.e., protrusions 108) of the support member 104. In this embodiment, drying of the substrate W (first drying process) and drying of the support member 104 (second drying process) are individually performed. The substrate W is separated from the support member 104, so that efficient drying of the entire upper and lower surfaces of the substrate W is achieved. Further, since the substrate W is placed on the support member 104 again after drying of the substrate W, the placement surface (protrusions 108) of the support member 104 is dried in advance.

The drying mechanism 110 includes air nozzles 112 arranged in three rows at the front side and three rows at the back side of the cleaning tank 92. The air nozzles 112 serve as "second nozzle". When the support member 104 is in the lowered position as shown in the drawing, the air can be uniformly jetted from the six air nozzles 112 toward the plurality of protrusions 108 (see double-dotted chain lines) to remove moisture from the upper surfaces of protrusions 108. An angle of each of air nozzles 112 is adjusted for this purpose.

The support member 104 can also be dried by blowing air from above with the air knife. However, considering that the support member 104 is a frame, and the protrusions 108 scattered on the frame are to be dried, there is no need to emit an air in a form of layer, which on the contrary can be considered inefficient. For this reason, in this embodiment, the air nozzles 112 are used in the drying mechanism 110. Details of the drying mechanism 110 will be described later.

Figure 5:
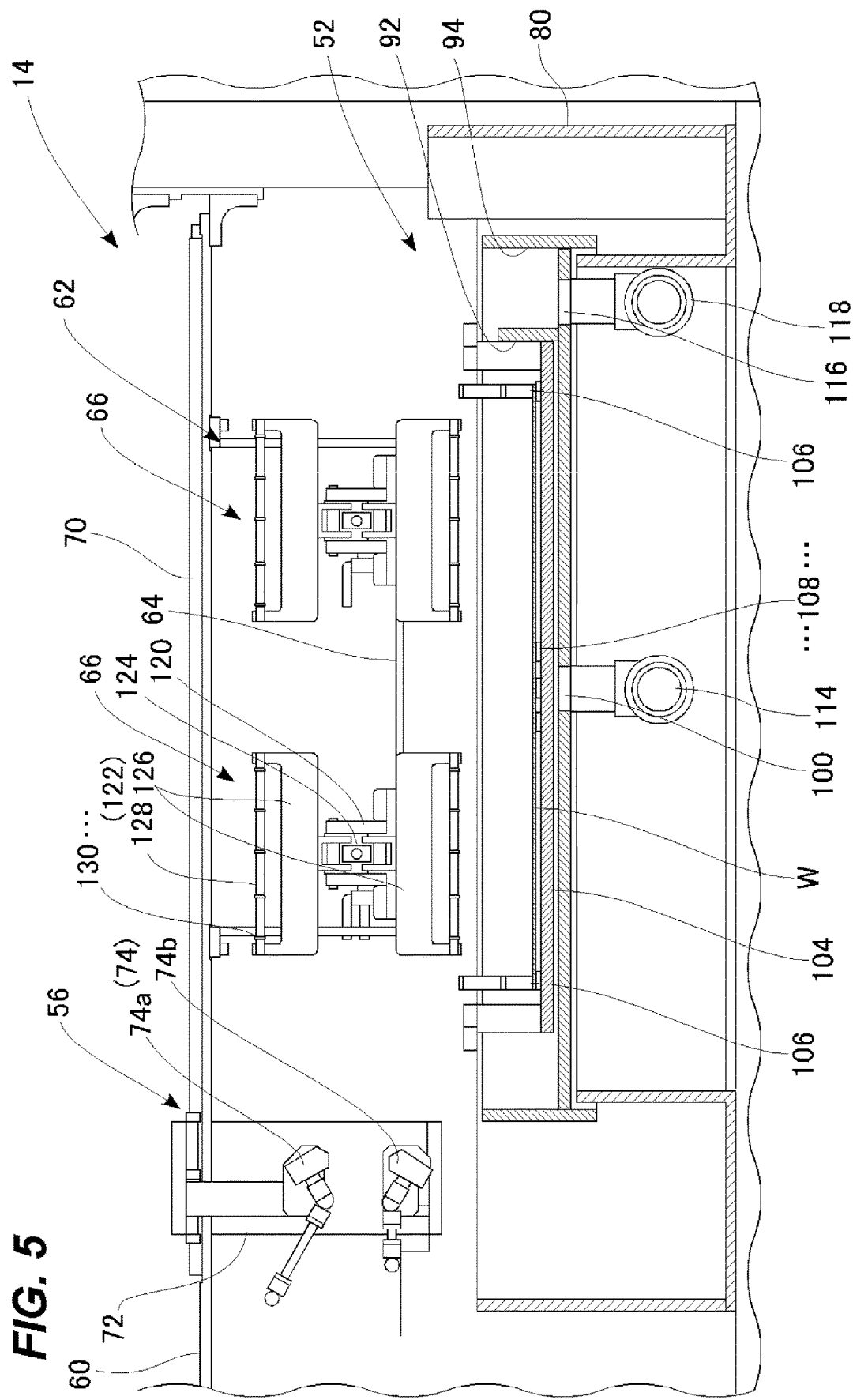
FIG. 5 is a vertical cross-sectional view showing a configuration of the cleaning device.
Figure 6:
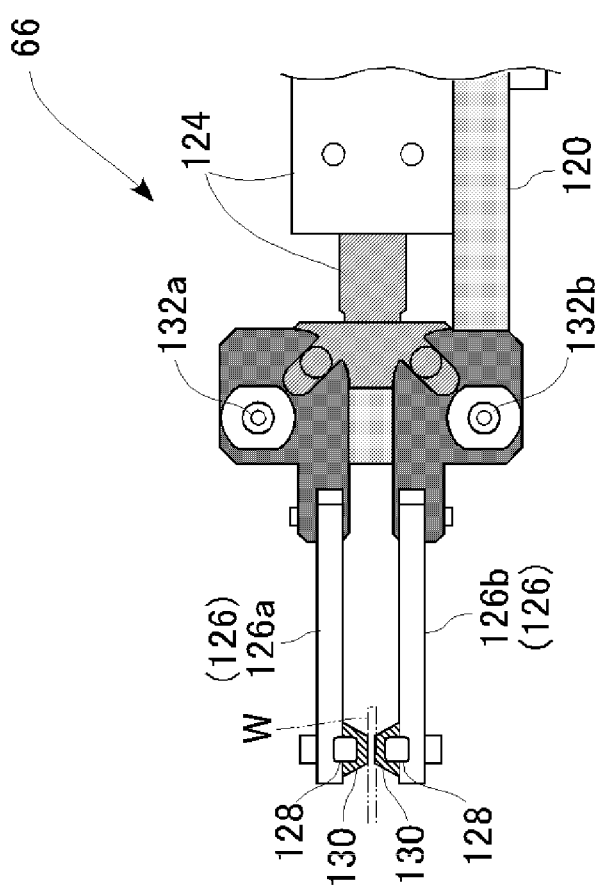
FIG. 6 is side views each showing configuration and operation of a clamp mechanism.
Figure 6:
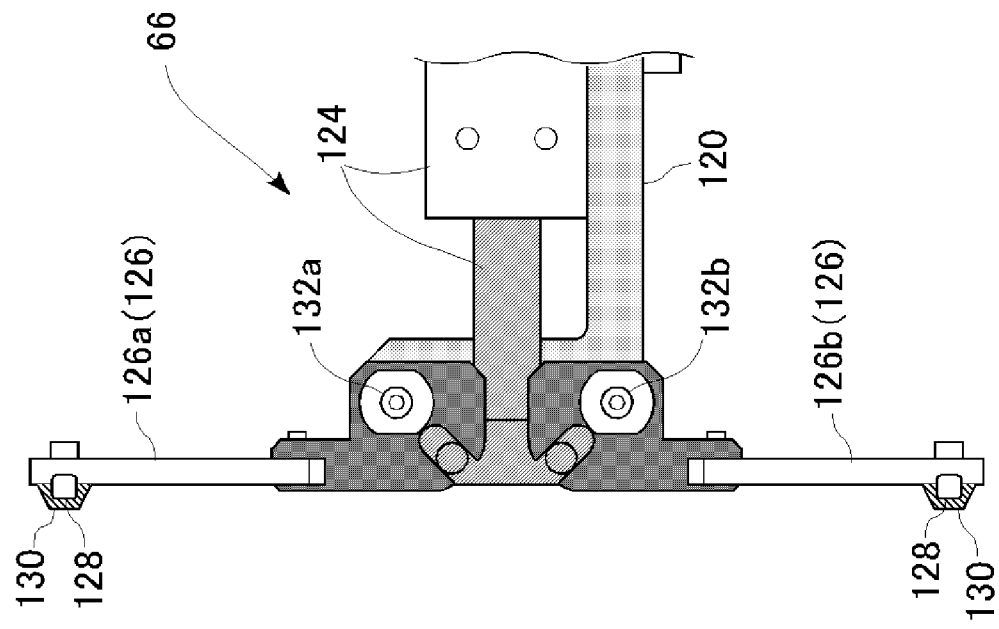

FIG. 5 is a vertical cross-sectional view showing a configuration of the cleaning device 14, and corresponds to a cross section as viewed along line indicated by arrows A-A in FIG. 1. FIG. 6 is side views each showing configuration and operation of the clamp mechanism 66. FIG. 6(a) illustrates an unclamping state, and FIG. 6(b) illustrates a clamping state.

As shown in FIG. 5, a drain pipe 114 is provided so as to communicate with the discharge port 100 of the cleaning tank 92. The processing liquid in the cleaning tank 92 is discharged through the drain pipe 114. Further, a discharge port 116 and a drain pipe 118 are also provided at a bottom of the overflow tank 94. The processing liquid that has overflowed the cleaning tank 92 is discharged through the drain pipe 118.

The air knife 74 has a slit nozzle, and is configured to jet a compressed air in a form of thin layer. The nozzle of the air knife 74a opens diagonally downward, and the nozzle of the air knife 74b opens diagonally upward. The tilt angles of both nozzles are set to be substantially the same with respect to the horizontal direction.

The clamp mechanism 66 has a base 120 fixed to the support base 64, a pair of upper and lower gripping portions 122 supported by the base 120, and an air cylinder 124 for driving the gripping portions 122. The gripping portion 122 includes T-shaped arms 126, and sandwiching members 128 fixed to distal end portions of the arms 126. Base end portions of the arms 126 are rotatably coupled to the base 120. The sandwiching members 128 are rod-shaped members, respectively. The distal end portion of each arm 126 has a U-shape, and each sandwiching member 128 is provided so as to bridge both ends of the U-shaped distal end portion. A plurality of O-rings 130 (seal rings) are provided along a longitudinal direction of the sandwiching member 128.

As shown in FIG. 6($a$), in a non-driving state of the clamp mechanism 66, a rod of the air cylinder 124 moves forward. This forward movement causes an upper arm 126$a$ to rotate clockwise in the drawing around a rotation shaft 132$a$, and causes a lower arm 126$b$ to rotate counterclockwise in the drawing around a rotation shaft 132$b$. As a result, the clamp mechanism 66 is in an open state (i.e., unclamping state).

On the other hand, as shown in FIG. 6($b$), in the driving state of the clamp mechanism 66, the rod of the air cylinder 124 moves backward. This backward movement causes the arm 126$a$ to rotate counterclockwise in the drawing, and causes the arm 126$b$ to rotate clockwise in the drawing. As a result, the clamp mechanism is in a state of sandwiching the substrate W (clamping state). In this clamping state, the pairs of upper and lower O-rings 130 sandwich the periphery of the substrate W.

Figure 7:
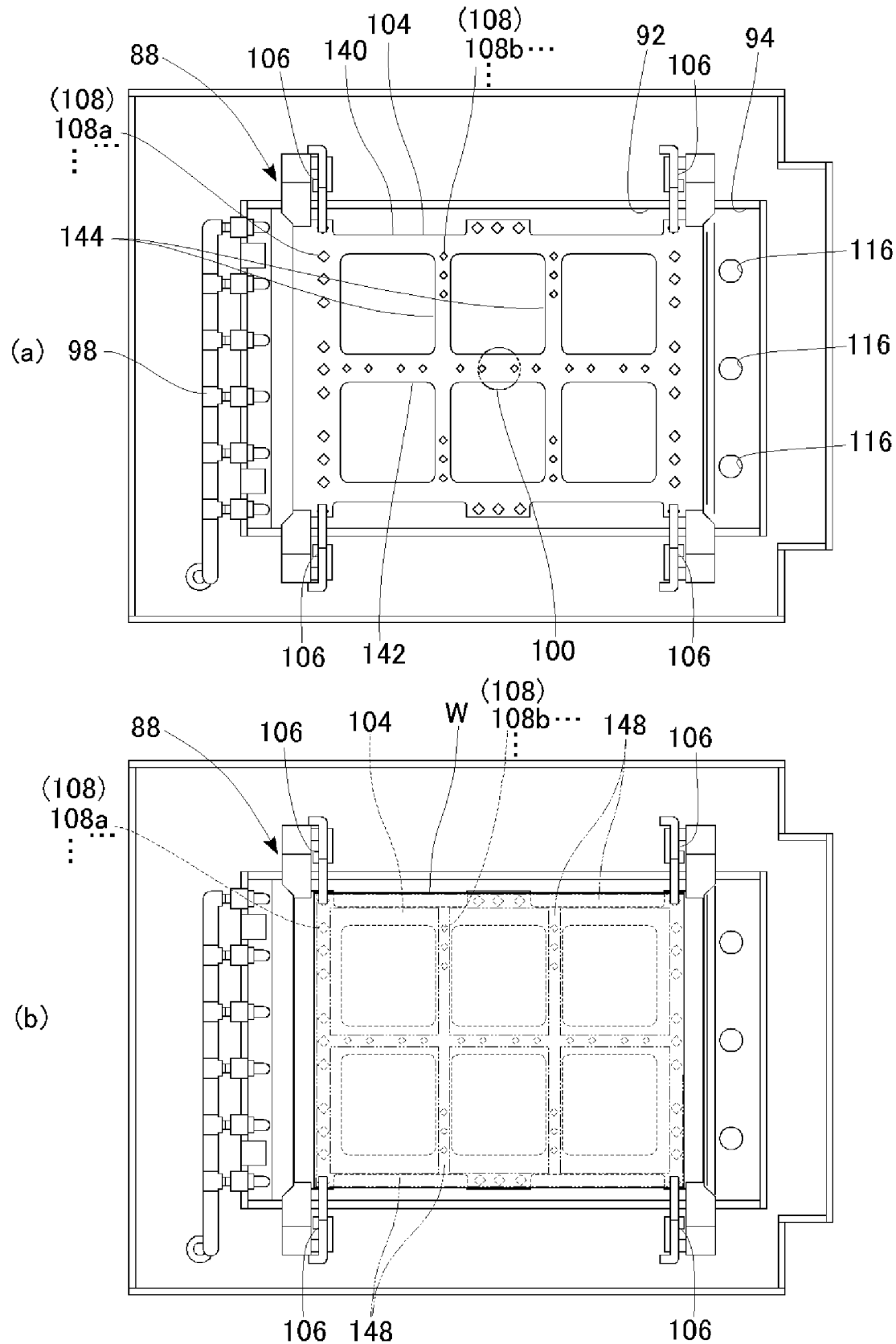
FIG. 7 is plan views each showing a configuration of the support mechanism.

FIG. 7 is plan views each showing a configuration of the support mechanism 88. FIG. 7($a$) illustrates a state in which the substrate W is not placed, and FIG. 7($b$) illustrates a state in which the substrate W is placed.

As shown in FIG. 7($a$), the support member 104 includes an outer frame 140 having a rectangular shape, a bridge portion 142 which bridges left and right sides of the outer frame 140, and two bridge portions 144 which bridge front and back sides of the outer frame 140, respectively. The support member 104 is formed in a grid pattern as a whole. Six empty regions, which are surrounded by the outer frame 140 and the bridge portions 142 and 144, have relatively large areas, which facilitate passing of the processing liquid.

The plurality of protrusions 108 are scattered on the upper surface of the support member 104. Each protrusion 108 may have a quadrangular or cylindrical shape, or may have a hemispherical shape. More specifically, a plurality of protrusions 108$a$ are provided along a peripheral edge of the outer frame 140, and a plurality of protrusions 108$b$ are provided along the longitudinal directions of the bridge portions 142 and 144. The protrusions 108$b$ are slightly smaller than the protrusions 108$a$.

As shown in FIG. 7($b$), band-shaped (grid-shaped) contactable regions 148 are set in a lower surface of the substrate W so as to correspond to the arrangements of the protrusions 108. Each contactable region 148 is a region where contact is allowed for the purpose of transporting the substrate, and is, for example, a region to which a circuit, such as interconnect and bump, is not mounted. The contactable region 148 of the substrate W is placed on the protrusions 108. Accordingly, the circuit-mounted portions in the substrate W are separated from the surface of the support member 104, so that the distribution of the cleaning liquid is ensured.

In this embodiment, the upper surface of the substrate W also has contactable regions as well as the lower surface of the substrate W. These contactable regions allow the substrate W to be cleaned and dried in the same way, regardless of which of two surfaces of the substrate W is placed on the support member 104.

Figure 8:
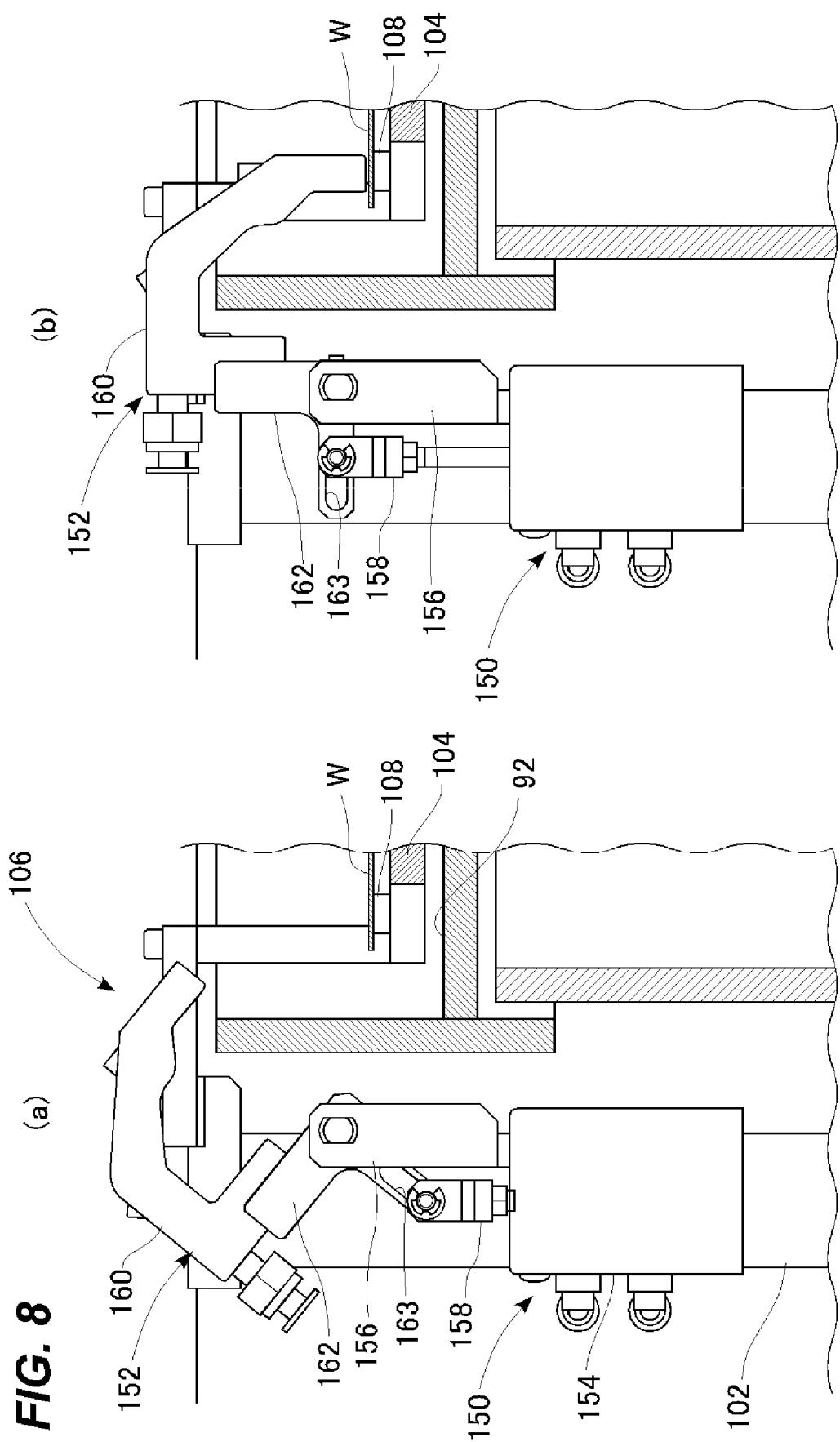
FIG. 8 is views each showing configuration and operation of the clamp mechanism.
Figure 9:
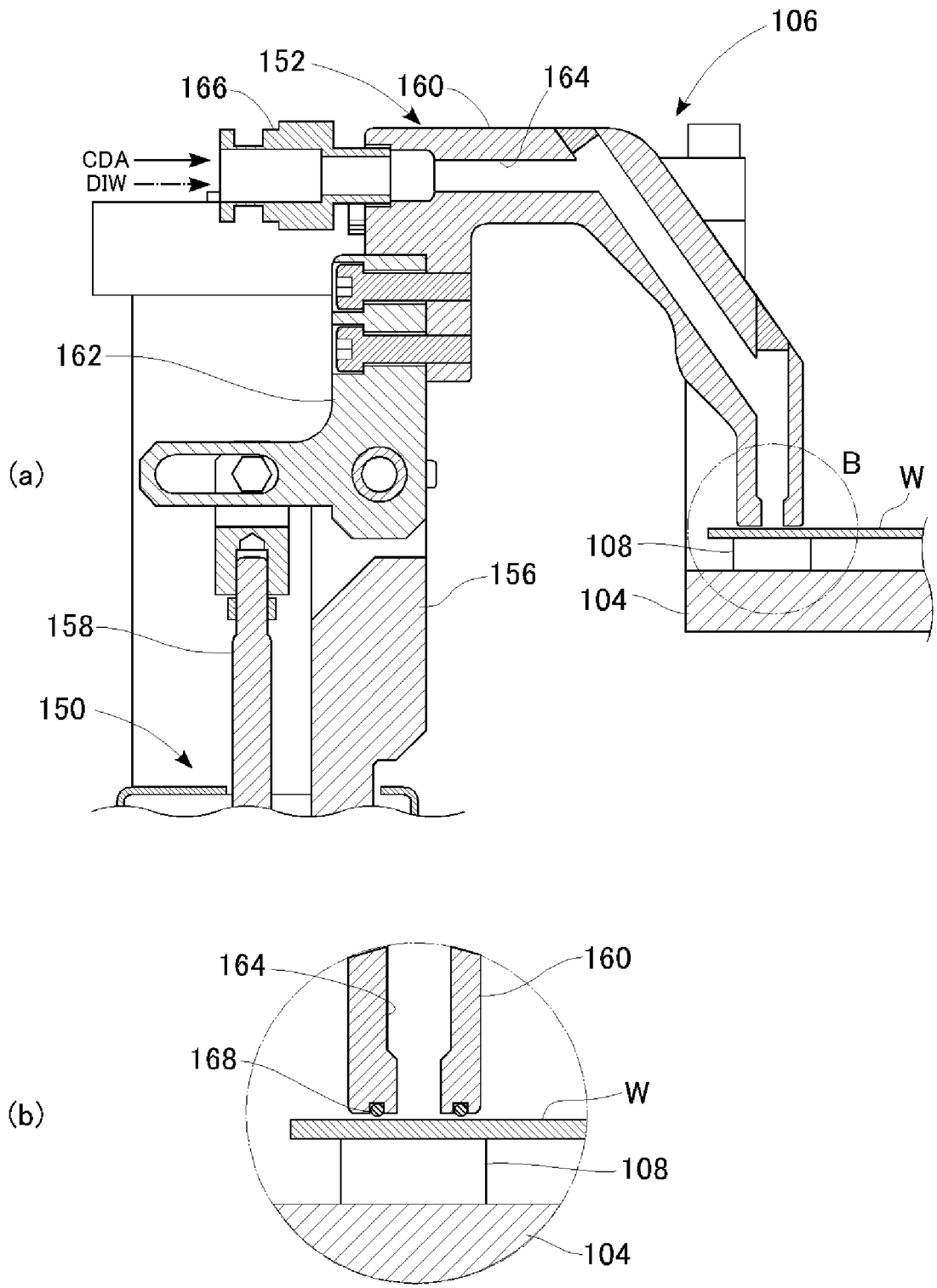
FIG. 9 is a view showing the configuration and operation of the clamp mechanism.

FIGS. 8 and 9 are views each showing configuration and operation of the clamp mechanism 106. FIG. 8($a$) illustrates an unclamping state, and FIG. 8($b$) illustrates a clamping state. FIG. 9($a$) is a cross-sectional view showing function and operation of the clamp mechanism 106 during cleaning and drying processes. FIG. 9 ($b$) is an enlarged view of part B of FIG. 9 ($a$).

As shown in FIG. 8($a$), the clamp mechanism 106 has an actuator 150 provided on an upper portion of the elevating shaft 102, and an arm 152 driven by the actuator 150. The actuator 150 comprises an air cylinder, which has a cylinder body 154, a support portion 156 secured to the cylinder body 154, and a piston rod 158 extending from the cylinder body 154.

The arm 152 has an L-shaped main body 160. The main body 160 is coupled to the piston rod 158 through an L-shaped coupling member 162. The coupling member 162 has one end fixed to the main body 160, and has a center rotatably supported by the support portion 156. The coupling member 162 has a slit 163 provided at the other end thereof, into which a distal end of the piston rod 158 is slidably inserted.

When the piston rod 158 is advanced by driving the actuator 150 in one direction, the coupling member 162 is rotated clockwise in the drawing. This rotation causes the arm 152 to operate in the clamping direction. As shown in FIG. 8($b$), a distal end of the arm 152 moves close to the upper surface of the substrate W supported by the support member 104. When the piston rod 158 is retracted by driving the actuator 150 in the other direction, the coupling member 162 is rotated counterclockwise in the drawing. This rotation causes the arm 152 to operate in the unclamping direction, as shown in FIG. 8($a$).

As shown in FIG. 9($a$), the main body 160 has a fluid passage 164 penetrating through the main body 160 and extending from a front end to a rear end of the main body 160. A pipe joint 166 is provided at the rear end of the main body 160. A pipe (not shown) is connected to the pipe joint 166, so that dry air (CDA) or deionized water (DIW) can be supplied into the fluid passage 164.

As described above, although the arm 152 and the substrate W are in a non-contact state, the fluid is emitted from the distal end of the main body 160. Thus, the fluid pressure acts as a clamping force, so that the substrate W can be sandwiched between the arm 152 and the support member 104. In this embodiment, the deionized water is supplied into the fluid passage 164 when the support member 104 is lowered into the cleaning tank 92 to immerse the substrate W in the processing liquid. On the other hand, during the elevating and lowering of the support member 104 or in the raised position thereof, the dry air is supplied into the fluid passage 164. Specifically, except when the clamp mechanism 106 releases the substrate W, any of the fluids is emitted to press the substrate W against the support member 104, so that the substrate W can be supported.

As shown in FIG. 9($b$), an O-ring 168 (seal ring) is provided on a distal end surface of the main body 160. This O-ring 168 (seal ring) can prevent a situation in which the distal end surface of the main body 160 directly contacts the substrate W and damages the substrate W, even if the rotation of the main body 160 in the clamp operation is excessive.

Figure 10:
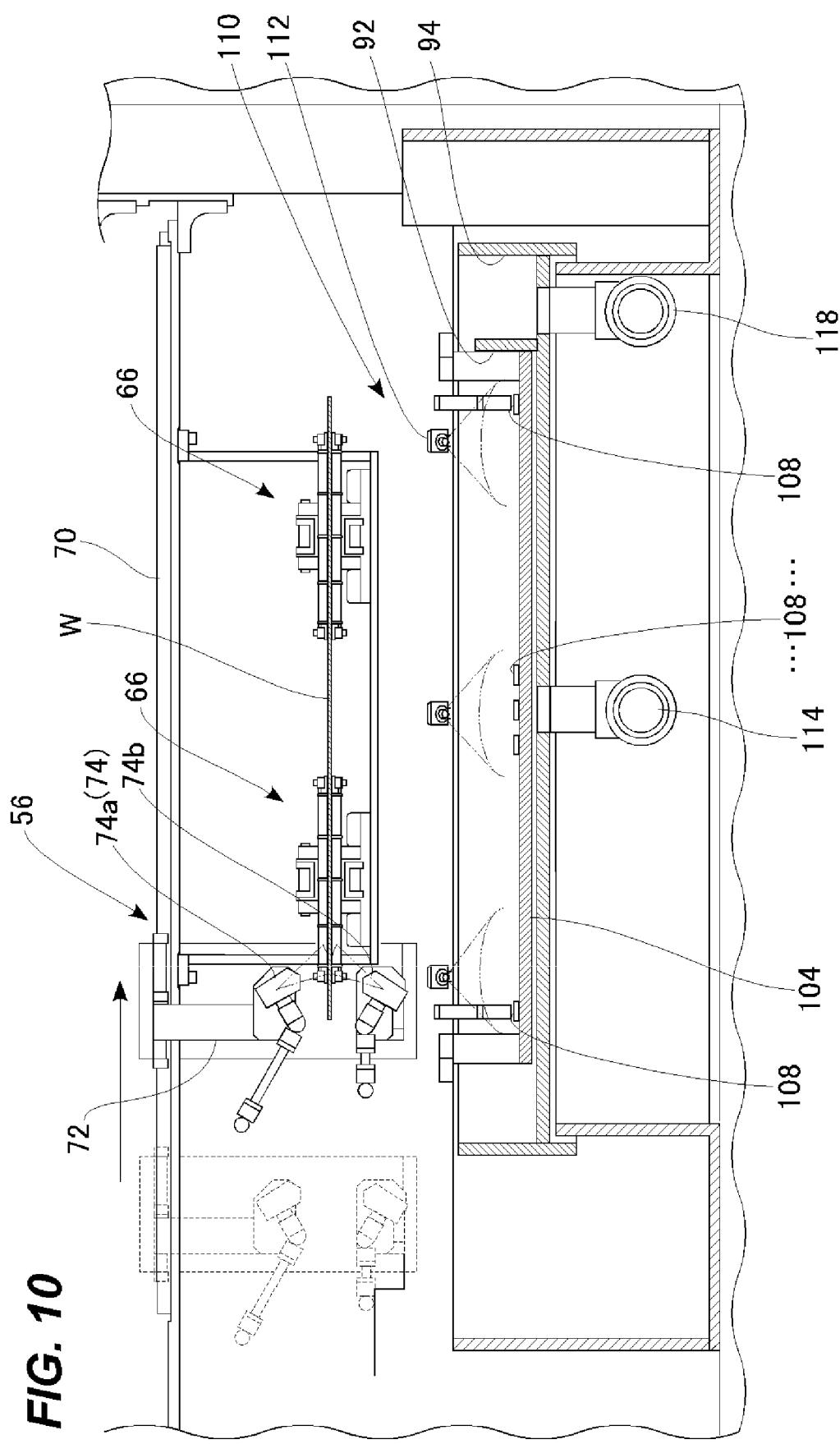
FIG. 10 is a view showing a state during a drying process.

FIG. 10 is a view showing a state during the drying process.

When the substrate W is to be dried, the drying mechanism 56 is driven while the substrate W is supported by the clamp mechanism 66. At this time, the air knives 74 emit the air toward the substrate W, while the drying mechanism 56 moves along the guide rail 70 as shown in the drawing. In this drying process, the substrate W is located between the air knife 74*a* and the air knife 74*b*. Therefore, both air knives can efficiently dry the upper and lower surfaces of the substrate.

In the meantime, the support member 104 is retreated into the drained cleaning tank 92, and the drying process is performed by use of the drying mechanism 110. The air emitted from the air nozzles 112 removes water droplets adhering to the protrusions 108. In this way, the first drying process by use of the drying mechanism 56, and the second drying process by use of the drying mechanism 110 are performed in parallel.

Next, a flow of cleaning control will be described.

Figure 11:
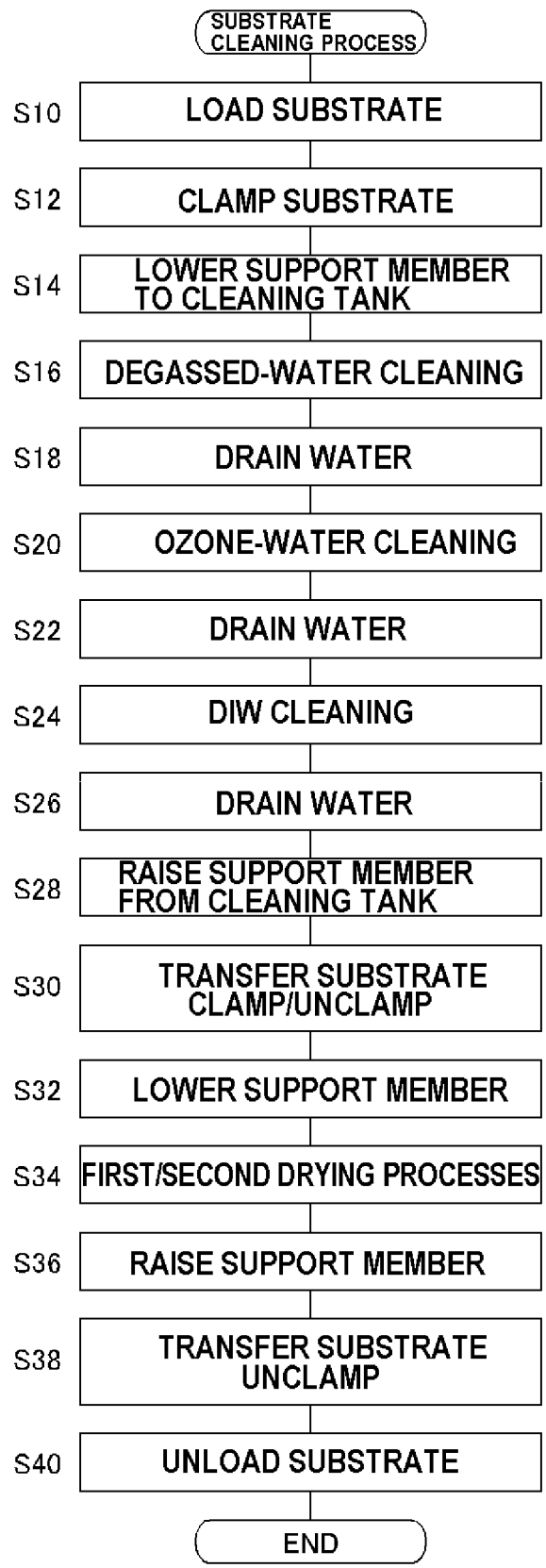
FIG. 11 is a flowchart showing a flow of the pre-cleaning process.
Figure 12:
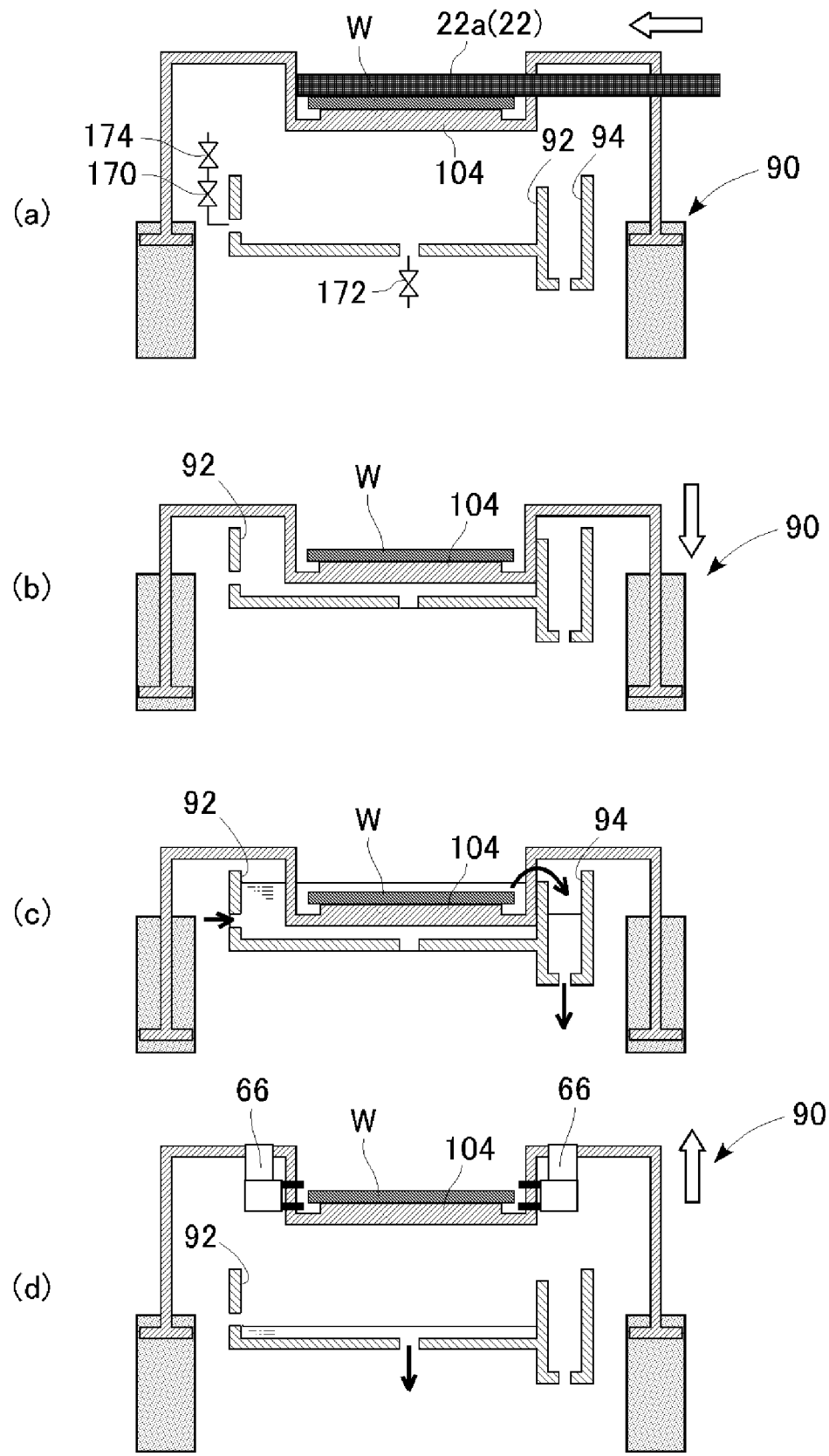
FIG. 12 is views illustrating a control method in the pre-cleaning process.
Figure 13:
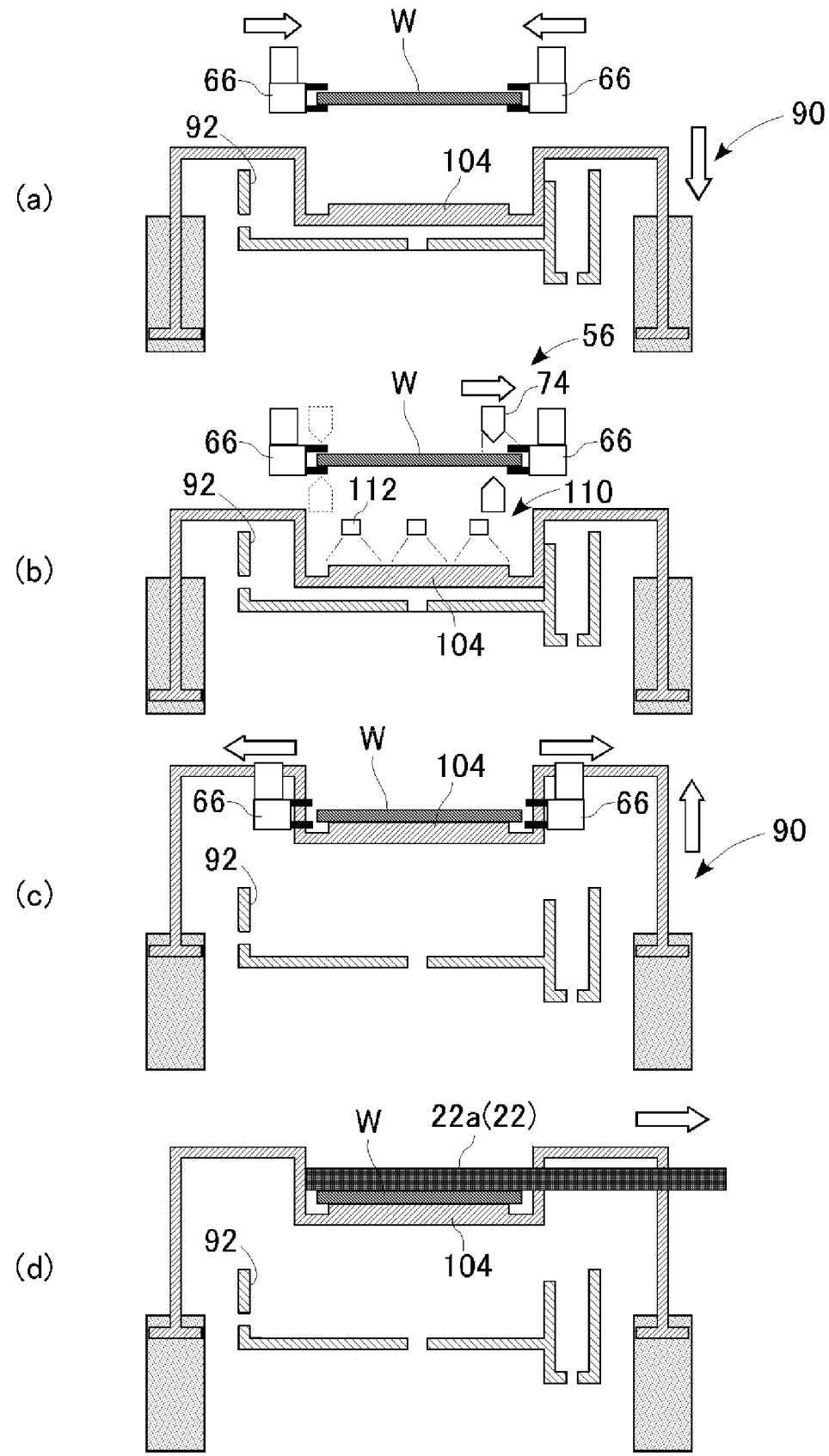
FIG. 13 is views illustrating the control method in the pre-cleaning process.

FIG. 11 is a flowchart showing a flow of the pre-cleaning process. FIGS. 12 and 13 are views illustrating a control method in the pre-cleaning process. Symbols (a) to (d) of each drawing represent the processing steps, respectively. For convenience, a supply valve 170, a discharge valve 172, and a switching valve 174 are illustrated only in FIG. 12(*a*), and depictions thereof are omitted in the other drawings. Following descriptions will be made based on FIG. 11, with reference to FIGS. 12 and 13 as appropriate.

Upon starting of the pre-cleaning process, the controller 6 instructs the elevating mechanism 90 and the substrate transfer robot 22 to operate so as to load the substrate W into the cleaning device 14 (see S10). As shown in FIG. 12(*a*), the elevating mechanism 90 raises the support member 104 to a loading position. The substrate transfer robot 22 removes the substrate W from the substrate transfer table 8 while holding it in a horizontal posture, and places the substrate W onto the support member 104. In this embodiment, the robot hand 22*a* is located on the upper side of the substrate W to hold the substrate W. At this time, the dry air is supplied through the fluid passage 164, so that the clamp mechanism 106 clamps the substrate W (see S12). At this point of time, the cleaning tank 92 is empty.

Subsequently, the controller 6 instructs the elevating mechanism 90 to operate so as to lower the support member 104 into the cleaning tank 92 while maintaining the clamped state of the substrate W (see S14). As shown in FIG. 12(*b*), the substrate W is placed in the cleaning tank 92. Then, as shown in FIG. 12(*c*), the controller 6 opens the supply valve 170 to supply deaerated water to the cleaning tank 92, and performs the pre-wetting process while allowing the deaerated water to overflow (see S16). At this time, the deionized water is supplied through the fluid passage 164, so that the clamp mechanism 106 maintains the clamped state of the substrate W. As a result, the resist openings of the substrate W are filled with the deaerated water, and bubbles are removed. In this embodiment, a time of the pre-wetting process is set to 60 seconds. When the pre-wetting process is terminated, the supply valve 170 is closed, and the discharge valve 172 is opened to drain the water (see S18).

Subsequently, the controller 6 operates the switching valve 174 to switch the processing liquid to the ozone water. Further, the controller 6 closes the discharge valve 172, and opens the supply valve 170 to supply the ozone water into the cleaning tank 92, so that the cleaning process is performed while allowing the ozone water to overflow (see S20). Since the resist openings of the substrate W have already been filled with the deaerated water, the deaerated water is replaced with the ozone water. The action of the ozone water removes organic substances and the like adhering to the surface of the substrate W, resulting in increased hydrophilicity. In this embodiment, a time of this cleaning process is set to 60 seconds. When the cleaning process is terminated, the supply valve 170 is closed, and the discharge valve 172 is opened to drain the water (see S22).

Subsequently, the controller 6 operates the switching valve 174 to switch the processing liquid to deionized water (DIW). Further, the controller 6 closes the discharge valve 172, and opens the supply valve 170 to supply the deionized water into the cleaning tank 92, so that the rinsing process is performed while allowing the deionized water to overflow (see S24). At this time, the deionized water is supplied through the fluid passage 164 of the clamp mechanism 106. In this embodiment, a time of this rinsing process is set to 30 seconds. When the rinsing process is terminated, the supply valve 170 is closed, the discharge valve 172 is opened to drain the water (see S26). The supply of deionized water through the fluid passage 164 is also stopped, and switched to the supply of dry air.

As shown in FIG. 12(*d*), the controller 6 instructs the elevating mechanism 90 to operate in parallel with the draining of water to raise the support member 104 to a dry position (see S28). Then, the substrate W is transferred from the support mechanism 88 to the support mechanism 54 (see S30). At this time, the substrate W is clamped by the clamp mechanism 66, while the clamping operation of the clamp mechanism 106 is terminated. The supply of dry air through the fluid passage 164 is stopped. When the transfer of the substrate W is completed, the support member 104 is lowered as shown in FIG. 13 (*a*) (see S32). In this embodiment, a height of the support member 104 at this time is the same as a height of the support member 104 during the cleaning process. In a modified example, these heights may be different.

When the support member 104 is retreated into the cleaning tank 92, the controller 6 instructs the drying mechanism 56 and the drying mechanism 110 to operate simultaneously (S34). As shown in FIG. 13(*b*), the air knives 74 dry the substrate W, and the air nozzles 112 dry the support member 104 (i.e., projections 108). At this time, the air is supplied through the fluid passage 164 of the clamp mechanism 106. In this way, the first and second drying processes are performed in parallel, so that influence due to liquid splashes occurring in each drying process can be suppressed. In this embodiment, each time of these drying processes is set to 30 seconds.

The air knives 74 do not move back and forth relative to the substrate W, and instead unidirectionally move to terminate the drying process. When the unidirectional moving is terminated, the air blow is stopped, and the air knives 74 are returned to their original positions. Upon termination of these drying processes, the supply of air through the fluid passage 164 is stopped. As shown in FIG. 13(*c*), the controller 6 instructs the elevating mechanism 90 to raise the support member 104 to the loading position (S36). Then, the substrate W is transferred from the support mechanism 54 to the support mechanism 88 (S38). After the substrate W is placed on the support member 104 again, the clamping operation of the clamp mechanism 66 is terminated.

As shown in FIG. 13(*d*), the controller 6 instructs the substrate transfer robot 22 to unload the substrate W (S40). The substrate transfer robot 22 removes the substrate W from the support member 104, and transports the substrate W to the loading and unloading mechanism 20. Then, the plating process described above is started.

After the plating process is terminated, the substrate W is transported to the cleaning device 16 where the post-cleaning process is performed. Configuration and operation of the cleaning device 16 are almost the same as those of the cleaning device 14, while the processing liquid to be supplied into the cleaning tank 92 is only deionized water (DIW). In the post-cleaning process, components of the plating solution and particles that have not been fully removed in the rinsing tank 38 are removed from the substrate W.

As described above, according to the present embodiment, the substrate W is placed on the support member 104, so that the substrate W can be raised and lowered while maintaining the horizontal posture, and the cleaning process can be performed. Since the transferring of the substrate W in the drying process is also performed while the substrate W is placed on the support member 104, the support mode can be stably switched from placing to gripping. Accordingly, the substrate W is not bent in a series of processes, and do not interfere with other structures. Therefore, even if the substrate W is a large and thin substrate, it can be processed stably.

Further, the plurality of protrusions 108 are scattered on the support member 104, and those protrusions 108 are used as the placement surface, so that most of the lower surface of the substrate W can be open to the cleaning liquid, and the cleaning liquid can be distributed over the entire upper and lower surfaces of the substrate W. As a result, the cleaning effect can be improved.

Further, since the support member 104 is retreated to the cleaning tank 92 during drying of the substrate W, it is not necessary to separately provide a retreat space for the support member 104. Furthermore, since the pre-wetting process with use of the deaerated water, the cleaning process with use of the ozone water, and the rinsing process with use of the deionized water are performed in the cleaning tank 92, it is not necessary to provide a processing tank for each of these processes. Such configuration enables the entire cleaning apparatus to be space-saving.

Further, the drying of the substrate W and the drying of the support member 104 (or the protrusions 108) are simultaneously performed in parallel, so that adverse effects, such as wetting of the protrusions 108 due to liquid splashing, particularly from the substrate W, can be suppressed. Since the drying of the support member 104 is performed within the cleaning tank 92, water droplets scattered during the drying process can be retained within the cleaning tank 92, and directly discharged through the discharge port 100. Further, the water droplets do not contaminate structures outside the cleaning tank 92.

Second Embodiment

Figure 15:
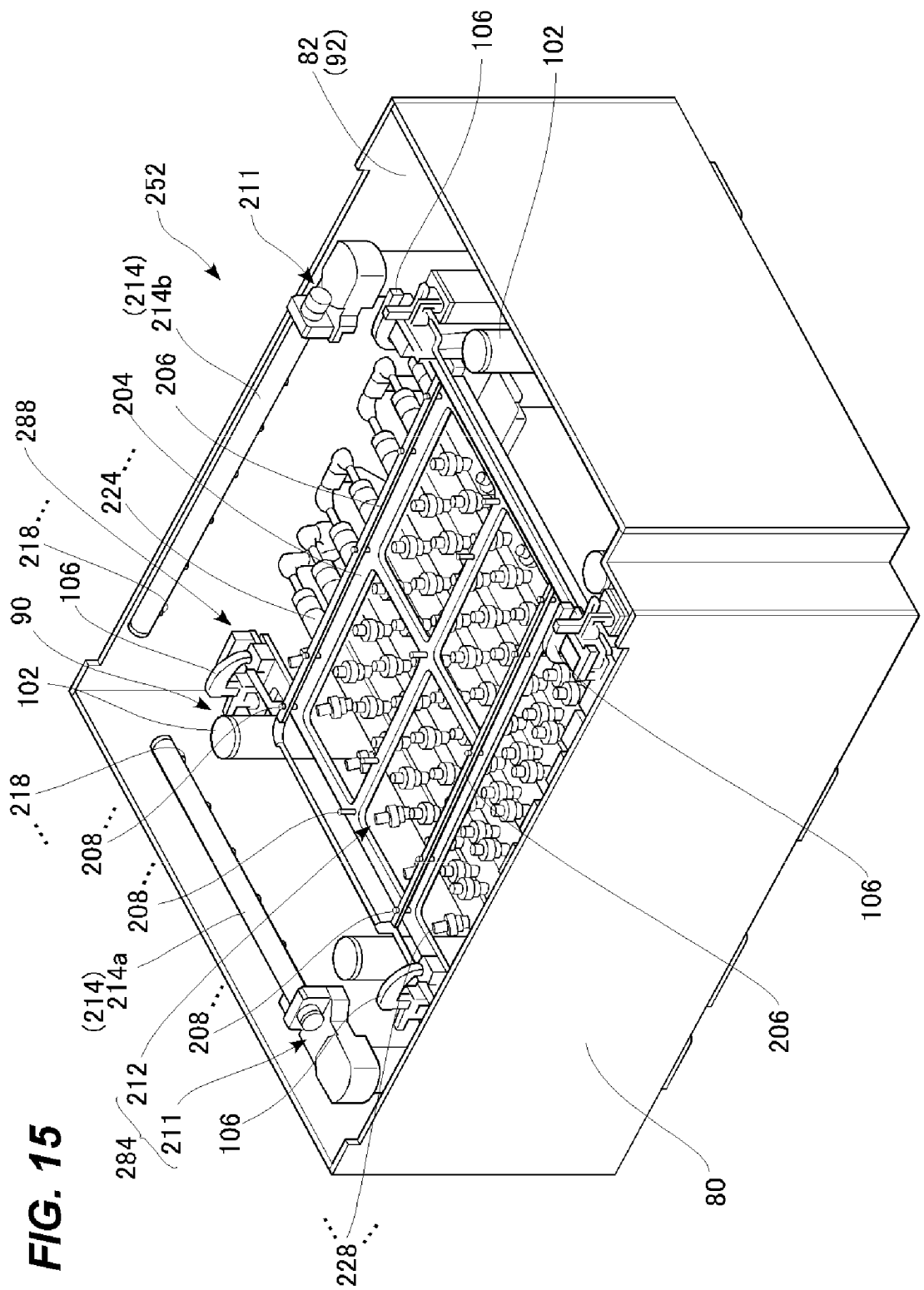
FIG. 15 is a perspective view showing a configuration of the cleaning unit according to a second embodiment.

FIG. 15 is a perspective view showing a configuration of the cleaning unit according to a second embodiment.

This embodiment is different from the first embodiment in that the cleaning unit is not a type in which the substrate is immersed in the cleaning liquid, but a type in which the cleaning liquid is sprayed onto the surface of the substrate (which may be referred to as "shower type"). Hereinafter, differences from the first embodiment will be mainly described. Unless otherwise specified in this embodiment, the same configuration as in the first embodiment can be applied.

In a cleaning unit 252 according to this embodiment, the case 80 serves as "processing tank 82 (or cleaning tank 92)". In the processing tank 82, supply mechanism 284, elevating mechanism 90, and support mechanism 288 are arranged. The supply mechanism 284 includes a first supply mechanism 211 and a second supply mechanism 212. The first supply mechanism 211 includes a pair of movable supply pipes 214*a* and 214*b* (which may be collectively referred to as "supply pipes 214" when they are not particularly distinguished). The supply pipes 214*a* and 214*b* have rotation shafts, respectively, extending in a vertical direction at two corners of the processing tank 82. These rotation shafts are arranged so as to be separated along one diagonal line of the processing tank 82.

Each supply pipe 214 extends in a horizontal direction from the rotation shaft thereof. The supply pipe 214 is located in an upper portion of the processing tank 82. The supply pipe 214 has a lower surface provided with a plurality of nozzles 218 which are arranged along an extending direction of the supply pipe 214. The nozzles 218 serve as "processing-liquid spray nozzles". The cleaning liquid is supplied downward from the supply pipes 214. As shown in the drawing, the supply pipe 214*b* is located higher than the supply pipe 214*a* such that the supply pipes 214*a* and 214*b* do not interfere with each other when both of them are rotated.

The second supply mechanism 212 has a plurality of supply pipes 224 arranged in parallel at a bottom of the processing tank 82. Each supply pipe 224 has an upper surface provided with a plurality of nozzles 228 which are arranged along an extending direction of the supply pipe 224. The nozzles 228 serve as "processing-liquid spray nozzles". The cleaning liquid is supplied upward from the supply pipes 224. A discharge port, which is not illustrated, is formed in the bottom of the processing tank 82. The cleaning liquid that has been supplied from the supply pipes 214 and 224 flows on the bottom of the processing tank 82 after cleaning the substrate, and is discharged through the discharge port.

The support mechanism 288 includes a support member 204 having a rectangular plate-shape, and clamp mechanisms 106 arranged at four corners around the support member 204. The support member 204 is formed in a grid pattern having four empty regions. A plurality of protrusions 208 are provided on an upper surface of the support member 204 along the grid pattern. The two sides of the support member 204 are provided with rod-shaped reinforcement members 206 that bridge the projections 208. The substrate is placed on these protrusions 208.

Figure 16:
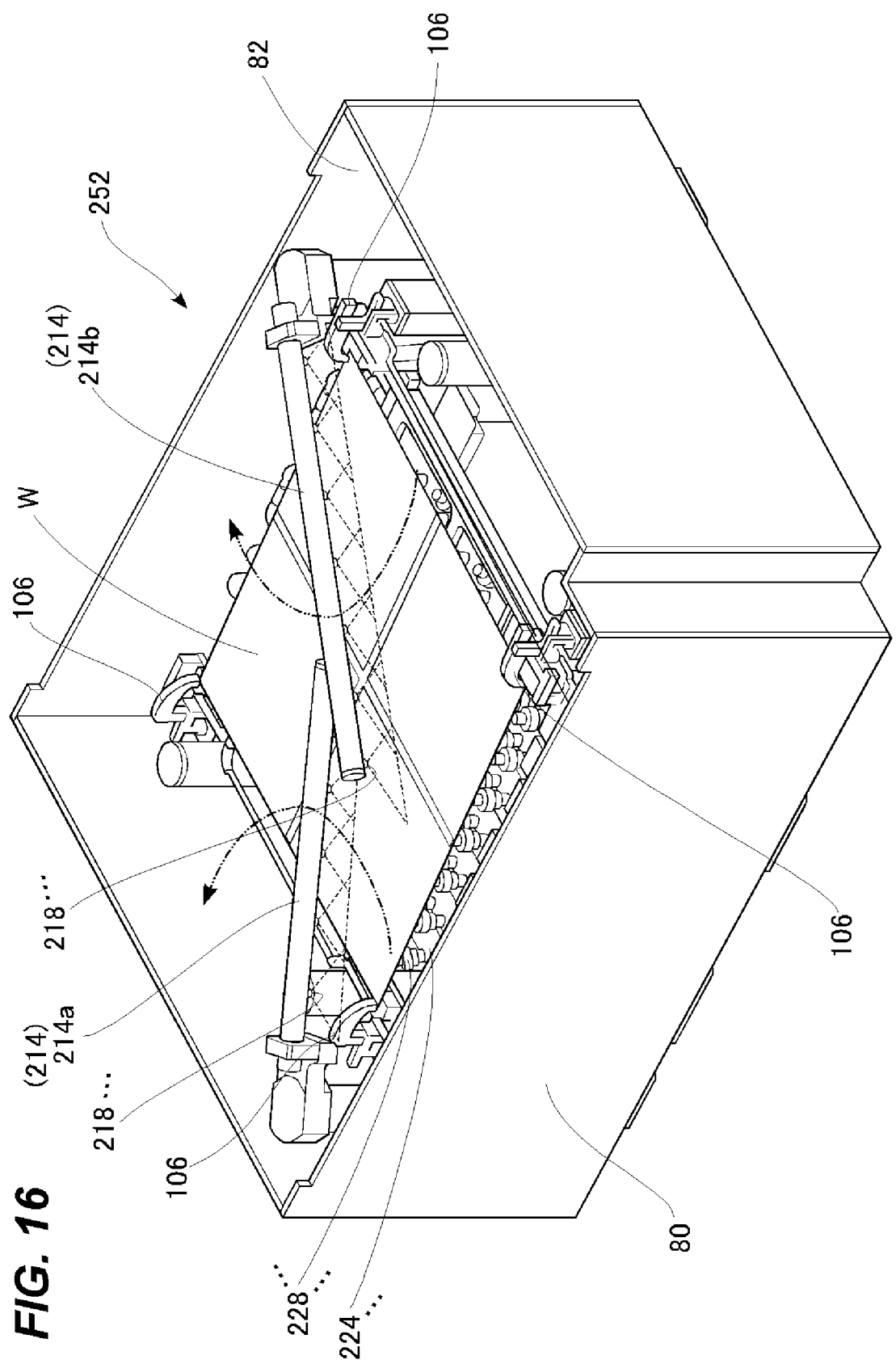
FIG. 16 is a perspective view showing operation of the cleaning unit during cleaning.

FIG. 16 is a perspective view showing operations of the cleaning unit 252 during cleaning.

When the cleaning unit 252 is driven in a state where the substrate W is placed on the placement surface (protrusions 208) of the support member 204, and the substrate W is clamped by the clamp mechanisms 106, the cleaning liquid is sprayed from the nozzles 218 while the supply pipes 214 are rotating. The cleaning liquid is also sprayed from the nozzles 228 of the supply pipes 224 at the same time. With these operations, the cleaning liquid is sprayed on the upper and lower surfaces of the substrate W. At this time, the supply pipes 214 spray the cleaning liquid while rotating about 90 degrees so as to scan the upper surface of the substrate W (see the two-dot chain arrows in the drawing). The supply pipes 214 may repeatedly scan to spray the cleaning liquid onto the substrate. In this case, in order to wash away the cleaning liquid from the substrate in one direction, each supply pipe 214 preferably scans in one direction. Further, in order to improve a drainage efficiency of the cleaning liquid on the surface of the substrate, the cleaning process is preferably performed with the support member 204 slightly inclined from the horizontal direction.

According to this embodiment, although the cleaning method is different, the posture (i.e., horizontal posture) of the substrate W during cleaning, the drying method, and the like are the same as those in the first embodiment. Therefore, the same effects as in the first embodiment can be obtained.

While the exemplary preferred embodiments of the present invention have been described above, it is understood that the present invention is not limited to those specific embodiments, but is capable of various changes and modifications within the scope of the inventive concept as expressed herein.

Figure 14:
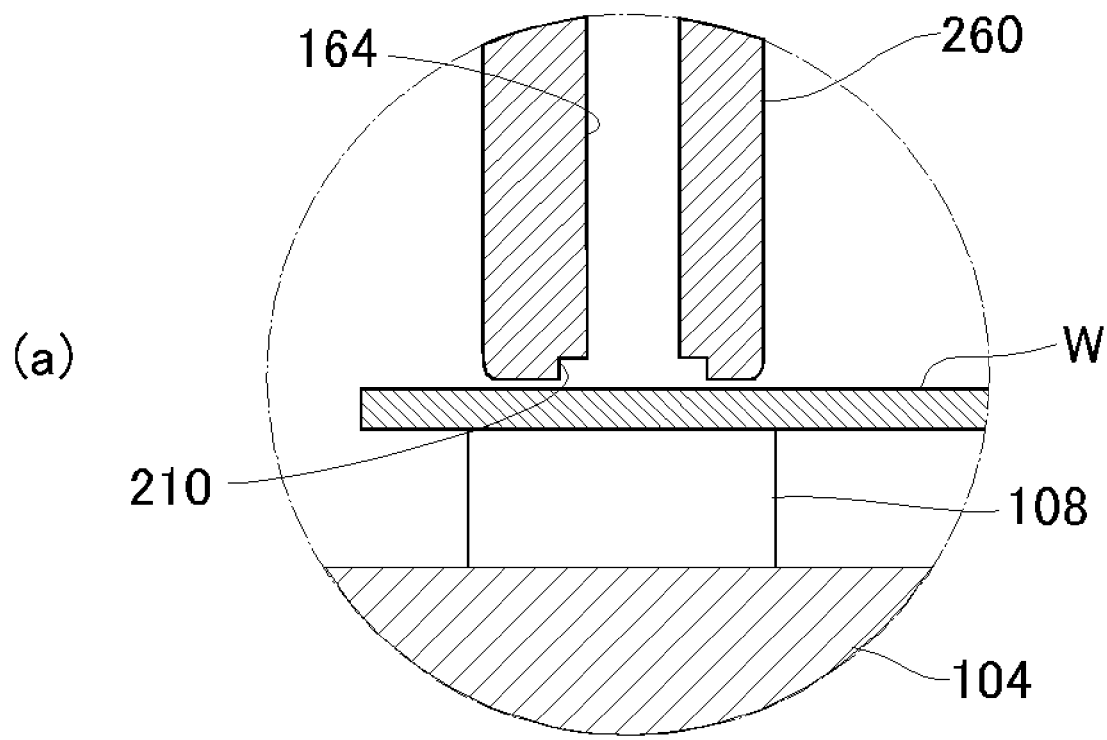
FIG. 14 is cross-sectional views each showing a clamp structure according to a modified example.
Figure 14:
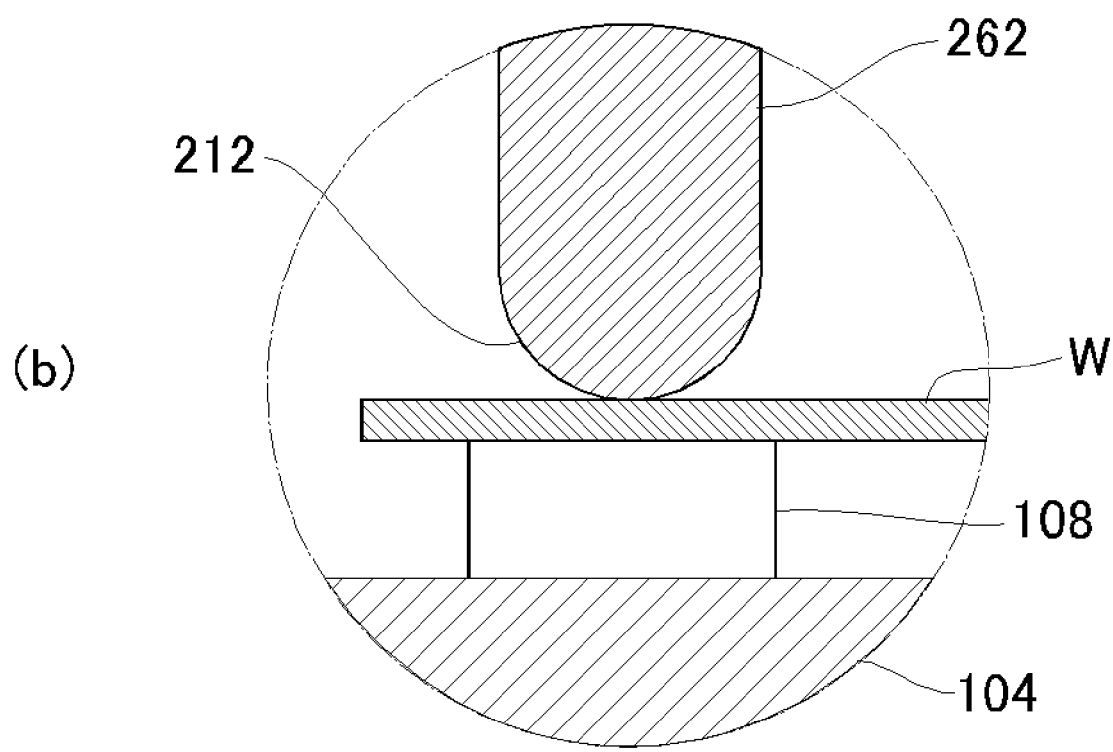

FIG. 14 is cross-sectional views each showing a clamp structure according to a modified example. FIG. 14 (a) illustrates a first modified example, and FIG. 14 (b) illustrates a second modified example.

In the clamp mechanism according to the above-described embodiments, as shown in FIG. 9(b), the O-ring 168 is provided at the distal end of the arm 152 to deal with the contact with the substrate W. In the first modified example, the distal end of the arm 260 has an enlarged diameter portion 210 with no O-ring. This configuration can increase an area on which the fluid pressure acts on the substrate W, thereby increasing the gripping force of the arm 260. In this case, at least the distal end of the arm 260 may preferably be made of a material having a low hardness.

In the second modified example, an arm 262 does not have a fluid passage, while a distal end thereof has a spherical shape. In this modified example, no dry air and no deionized water are supplied by the clamp mechanism. The periphery of the substrate W is sandwiched between the arm 262 and the support member 104. According to this modified example, the arm 262 makes a point contact with the substrate W, thereby reducing the contact area to a small size. Accordingly, damage to the substrate W can be suppressed, and contamination due to the contact can be minimized. In this case also, at least the distal end of the arm 262 may preferably be made of a material having a low hardness.

In the above-described embodiments, the pre-cleaning section 10 and the plating section 4 are set in different regions in the plating apparatus 1. In a modified example, the function of the pre-cleaning section 10 may be incorporated into the plating section. For example, in the plating section 4 shown in FIG. 1, a pre-cleaning tank may be provided between the pre-wetting tank 30 and the pre-soak tank 32 so that ozone-water cleaning and rinsing process can be performed.

In the above-discussed first embodiment, as shown in FIG. 7(a), the support member 104 is formed in the grid pattern (frame shape) divided into the six frame regions. However, the number of frame regions is not limited to six, and the number of frame regions may be freely set according to the arrangement of the contactable regions 148 set on the substrate W.

Although not described in the above-described embodiments, a plurality of types of support members that can be replaced according to the type of the substrate may be prepared to be attached to and detached from the cleaning unit. This is in consideration of the fact that the layout of mounted areas and no-mounted areas differs depending on the type of substrate. The plurality of types of support members have sizes, shapes, and layouts of protrusions corresponding to no-mounted areas (i.e., contactable regions) of any of the substrates. Such configuration allows for processing of substrates having a wide variety of sizes and mount layouts.

Although not described in the above-described embodiments, the presence or absence of ozone-water cleaning in the pre-cleaning process may be determined according to a time from the cleaning of the substrate W in the upstream process to the transfer of the substrate W to the plating apparatus 1. Even if the cleaning of substrate W is performed in the upstream process, organic substances may adhere to the seed layer exposed in the resist openings of the substrate W again as time passes. Therefore, specifically, the controller (management section) obtains time information for each substrate W that has been cleaned in the upstream process, and calculates an elapsed time until the substrate W is set on the substrate transfer table 8. When the elapsed time is equal to or more than a predetermined time, the ozone cleaning is performed, and when the elapsed time is less than the predetermined time, ozone cleaning may be omitted. In this manner, the presence or absence of ozone cleaning may be determined according to the estimated contamination level of the substrate W. Alternatively, a time for the ozone cleaning may be changed according to a contamination level. Excessive ozone cleaning may damage the seed layer (conducting layer), and thus it is preferable to set the optimum cleaning conditions in this way.

Although not described in the first embodiment, when the processing liquid is supplied into the cleaning tank 92, the substrate W may be slightly tilted at least until the substrate W is immersed. Specifically, in the state shown in FIG. 5, the operations of the four elevating shafts 10 are controlled to tilt the support member 104 at a slight angle with respect to the horizontal plane (for example, about $1/1000$ to $1/100$). At this time, a side of the support member 104 at the overflow tank 94 (right side) is set to be low.

This allows the substrate W to be gradually immersed in the processing liquid from the right side to the left side. This means that a space between the lower surface of the substrate W and the liquid surface of the processing liquid is gradually shifted to the left side, i.e., air is moved to the side opposite to the overflow tank 94. Accordingly, air bubbles can hardly flow into the overflow tank 94. In other words, it is possible to prevent or suppress the formation of bubble accumulation in the overflow tank 94, which reduces the efficiency of the overflow. In this case, it is preferable to return the substrate W to the horizontal position after the substrate W is fully immersed in the processing liquid. The substrate may be returned to the horizontal position after the deaerated-water cleaning is terminated.

According to the substrate processing apparatus provided with such clamp mechanism, the clamp portion can be processed at the same time as the processing of the substrate, thereby increasing the efficiency of the substrate processing as a whole.

It should be understood that the present invention is not limited to the above-described embodiments and modified examples, and the components may be modified and embodied without departing from the scope of the disclosure. It should be understood that the plurality of components disclosed in the above-described embodiments and modified examples are appropriately combined to make various inventions. Further, it should be understood that some components may be omitted from all components described in the above-described embodiments.

INDUSTRIAL APPLICABILITY

The present invention is applicable to a substrate processing apparatus configured to process a substrate with a processing liquid.

REFERENCE SIGNS LIST 1 plating apparatus, 2 substrate loading and unloading section, 4 plating section, 6 controller, 8 substrate transfer table, 10 pre-cleaning section, 12 post-cleaning section, 14 cleaning device, 16 cleaning device, 18 holder transporting mechanism, 20 loading and unloading mechanism, 22 substrate transfer robot, 23 moving mechanism, 24 substrate holder, 28 transporting mechanism, 30 pre-wetting tank, 32 pre-soak tank, 34 rinsing tank, 36 blow tank, 38 rinsing tank, 40 overflow tank, 42 plating tank, 52 cleaning unit, 54 support mechanism, 56 drying mechanism, 60 guide member, 66 clamp mechanism, 74 air knife, 82 processing tank, 84 supply mechanism, 86 discharge mechanism, 88 support mechanism, 90 elevating mechanism, 92 cleaning tank, 94 overflow tank, 96 supply port, 98 supply pipe, 100 discharge port, 102 elevating shaft, 104 support member, 106 clamp mechanism, 108 protrusion, 110 drying mechanism, 112 air nozzle, 114 drain pipe, 116 discharge port, 118 drain pipe, 122 gripping portion, 124 air cylinder, 126 arm, 128 sandwiching member, 130 O-ring, 148 contactable region, 150 actuator, 152 arm, 164 fluid passage, 168 O-ring, 170 supply valve, 172 discharge valve, 174 switching valve, 204 support member, 208 protrusion, 210 enlarged diameter portion, 211 first supply mechanism, 212 second supply mechanism, 214 supply pipe, 218 nozzle, 224 supply pipe, 228 nozzle, 252 cleaning unit, 260 arm, 262 arm, 284 supply mechanism, 288 support mechanism, W substrate

The invention claimed is:

1. A substrate processing apparatus comprising:
a support portion having a placement surface on which a substrate is placed in a horizontal posture, the support portion including a frame and protrusions protruding from an upper surface of the frame to form the placement surface;
a processing tank configured to supply a processing liquid to the substrate and process the substrate;
an elevating portion configured to raise and lower the support portion in order to lower the substrate into the processing tank and raise the substrate from the processing tank;
a gripping portion configured to grip a periphery of the substrate supported by the support portion above the processing tank, and receive the substrate from the support portion; and
a first nozzle configured to emit a gas onto the substrate, gripped by the gripping portion, to dry the substrate.

2. The substrate processing apparatus according to claim 1, further comprising a controller configured to control the elevating portion so as to lower the support portion after gripping of the substrate by the gripping portion.

3. The substrate processing apparatus according to claim 2, further comprising:
a processing-liquid supply portion configured to supply the processing liquid to the processing tank; and
a processing-liquid discharge portion configured to discharge the processing liquid from the processing tank,
wherein the controller is configured to control the processing-liquid discharge portion so as to discharge the processing liquid from the processing tank before or after the support portion is raised.

4. The substrate processing apparatus according to claim 3, further comprising a second nozzle configured to emit a gas onto the placement surface of the support portion to dry the placement surface.

5. The substrate processing apparatus according to claim 4, wherein the second nozzle is configured to dry the placement surface of the support portion that has been lowered into the processing tank from which the processing liquid has been discharged.

6. The substrate processing apparatus according to claim 4, further comprising:
a substrate transporter having a supporting surface configured to support an upper surface of the substrate, the substrate transporter being configured to transfer the substrate to the placement surface of the support portion and receive the substrate from the placement surface while maintaining the substrate in the horizontal posture,
wherein the controller is configured to control the elevating portion so as to raise the support portion after the placement surface is dried by the second nozzle to support the substrate, gripped by the gripping portion, with the placement surface of the support portion, and
the substrate transporter is configured to receive the substrate supported by the placement surface.

7. The substrate processing apparatus according to claim 3, wherein the processing tank includes a substrate cleaning tank, and
the processing liquid supply portion is configured to supply a plurality of types of cleaning liquids successively into the substrate cleaning tank.

8. The substrate processing apparatus according to claim 1, further comprising a supply mechanism configured to spray the processing liquid onto the surface of the substrate, supported by the support portion, in the processing tank.

9. The substrate processing apparatus according to claim 8, wherein the supply mechanism includes a pair of movable supply pipes having rotation shafts, respectively, extending in a vertical direction at two corners of the processing tank, the rotation shafts being arranged away from each other along a diagonal line of the processing tank, the movable supply pipes extending in a horizontal direction from the rotation shafts, and processing-liquid spray nozzles being arranged along an extending direction of each of the movable supply pipes.

* * * * *